(12) United States Patent
Jao et al.

(10) Patent No.: US 7,804,327 B2
(45) Date of Patent: Sep. 28, 2010

(54) LEVEL SHIFTERS

(75) Inventors: Che Yuan Jao, Hsinchu (TW);
Yuan-Chin Liu, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/871,234

(22) Filed: Oct. 12, 2007

(65) Prior Publication Data

US 2009/0096484 A1    Apr. 16, 2009

(51) Int. Cl.
H03K 19/0175    (2006.01)
(52) U.S. Cl. .......................................... 326/80; 326/68
(58) Field of Classification Search .................... 326/62, 326/63, 68, 80–83, 56–58; 327/333
See application file for complete search history.

(56) References Cited

U.S. PATENT DOCUMENTS

| | | | |
|---|---|---|---|
| 5,669,684 A | 9/1997 | Agan | |
| 6,154,845 A | 11/2000 | Ilkbahar et al. | |
| 6,212,050 B1 | 4/2001 | Haider | |
| 6,320,406 B1 * | 11/2001 | Morgan et al. | 326/14 |
| 6,342,802 B1 | 1/2002 | Forehand | |
| 6,586,974 B1 | 7/2003 | Humphrey et al. | |
| 6,781,413 B2 | 8/2004 | Kihara et al. | |
| 6,785,107 B1 | 8/2004 | Schmitt | |
| 6,822,479 B1 | 11/2004 | Rosen | |
| 6,906,552 B2 * | 6/2005 | Ajit | 326/81 |
| 7,002,371 B2 | 2/2006 | Kase et al. | |
| 7,005,908 B2 | 2/2006 | Lee et al. | |
| 7,038,492 B2 | 5/2006 | Wu et al. | |
| 7,205,820 B1 | 4/2007 | Yeung | |
| 7,471,113 B1 * | 12/2008 | Lim | 326/87 |
| 2003/0098712 A1 * | 5/2003 | Kihara et al. | 326/81 |
| 2005/0134355 A1 * | 6/2005 | Maede et al. | 327/333 |
| 2005/0270065 A1 * | 12/2005 | Bhattacharya et al. | 326/81 |
| 2005/0270066 A1 * | 12/2005 | Kozawa | 326/81 |

FOREIGN PATENT DOCUMENTS

CN    101047381 A    10/2007

OTHER PUBLICATIONS

English abstract of CN101047381, pub. Oct. 3, 2007.

* cited by examiner

Primary Examiner—Rexford N Barnie
Assistant Examiner—Jany Tran
(74) Attorney, Agent, or Firm—Thomas, Kayden, Horstemeyer & Risley

(57) ABSTRACT

Level shifters capable of setting logic level of the output signals thereof to a pre-defined known state during power-up are provided, in which a first logic unit is powered by a first power voltage, receives input signals with a core power voltage and comprises first and second output terminals. First and second drivers are coupled between the first output terminal and the first power voltage and between the second output terminal and the second power voltage respectively. When one of the first and second power voltages is not ready during power-up, the first driver matches a voltage level on the first output terminal with the first power voltage by AC coupling and the second driver pulls low or maintains a voltage level on the second output terminal.

19 Claims, 23 Drawing Sheets

| | OE_HV | PJ_HV | SN_HV | WPUJ_HV | WPD_HV |
|---|---|---|---|---|---|
| Weak 0 | 0 | × | × | Follow VDD_IO | Follow VDD_IO |
| Weak 1 | 0 | × | × | 0 | 0 |
| High_Z | 0 | × | × | Follow VDD_IO | 0 |
| Strong 0 | Follow VDD_IO | Follow VDD_IO | Follow VDD_IO | Follow VDD_IO | 0 |
| Strong 1 | Follow VDD_IO | 0 | 0 | Follow VDD_IO | 0 |

FIG. 21

LEVEL SHIFTERS

BACKGROUND OF THE INVENTION

1. Field of the Invention

The invention relates to semiconductor devices, and in particular to level shifters.

2. Description of the Related Art

Advanced system boards can receive a core power voltage, for example about 1.0V, powering a core circuit of an integrated circuit and an input/output power voltage, for example about 3.3V, powering various drivers, such as input buffers, output buffers or pre-drivers of an integrated circuit or others. In such systems, level shifters are typically powered by the core power voltage and the I/O power voltage, level-shifting signals with core power voltage to signals with I/O power voltage.

BRIEF SUMMARY OF THE INVENTION

Embodiments of a level shifter are provided, in which a first logic unit is powered by an input/output (I/O) power voltage, receives input signals with a core power voltage and comprises first and second output terminals. A first driver is coupled to the first output terminal, matching a voltage level on the first output terminal with the I/O power voltage by AC coupling when the core power voltage is not ready during power-up.

The invention provides another embodiment of a level shifter, in which a first logic unit is powered by an input/output (I/O) power voltage, receives input signals with a core power voltage and comprises first and second output terminals. A first driver is coupled to the first output terminal, pulling a voltage level on the first output terminal low when the core power voltage is not ready during power-up.

The invention provides an embodiment of an I/O buffer, in which a plurality of the disclosed level shifters are provided, and a plurality of driving units are coupled between the level shifters and a pad, selectively setting a logic state of the pad to one of N predetermined logic states according to the voltages on the first or second output terminal of the level shifters during power-up.

The invention provides an embodiment of a malfunction protection method for a level shifter powered by an I/O power voltage and a core power voltage, in which a first driver is disposed between the I/O power voltage and a first output terminal of the level shifter, matching a voltage level on the first output terminal with the I/O power voltage by AC coupling when the core power voltage is not ready during power-up.

The invention provides another embodiment of a level shifter, in which a first logic unit is powered by a first power voltage, receives input signals with a core power voltage and comprises first and second output terminals. First and second drivers are coupled between the first output terminal and the first power voltage and between the second output terminal and the second power voltage respectively. When one of the first and second power voltages is not ready during power-up, the first driver matches a voltage level on the first output terminal with the first power voltage by AC coupling and the second driver pulls low or maintains a voltage level on the second output terminal.

BRIEF DESCRIPTION OF THE DRAWINGS

The invention can be more fully understood by reading the subsequent detailed description and examples with references made to the accompanying drawings, wherein:

FIG. 21 shows a relationship between the driving signals and logic states of output signal of the level shifter.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
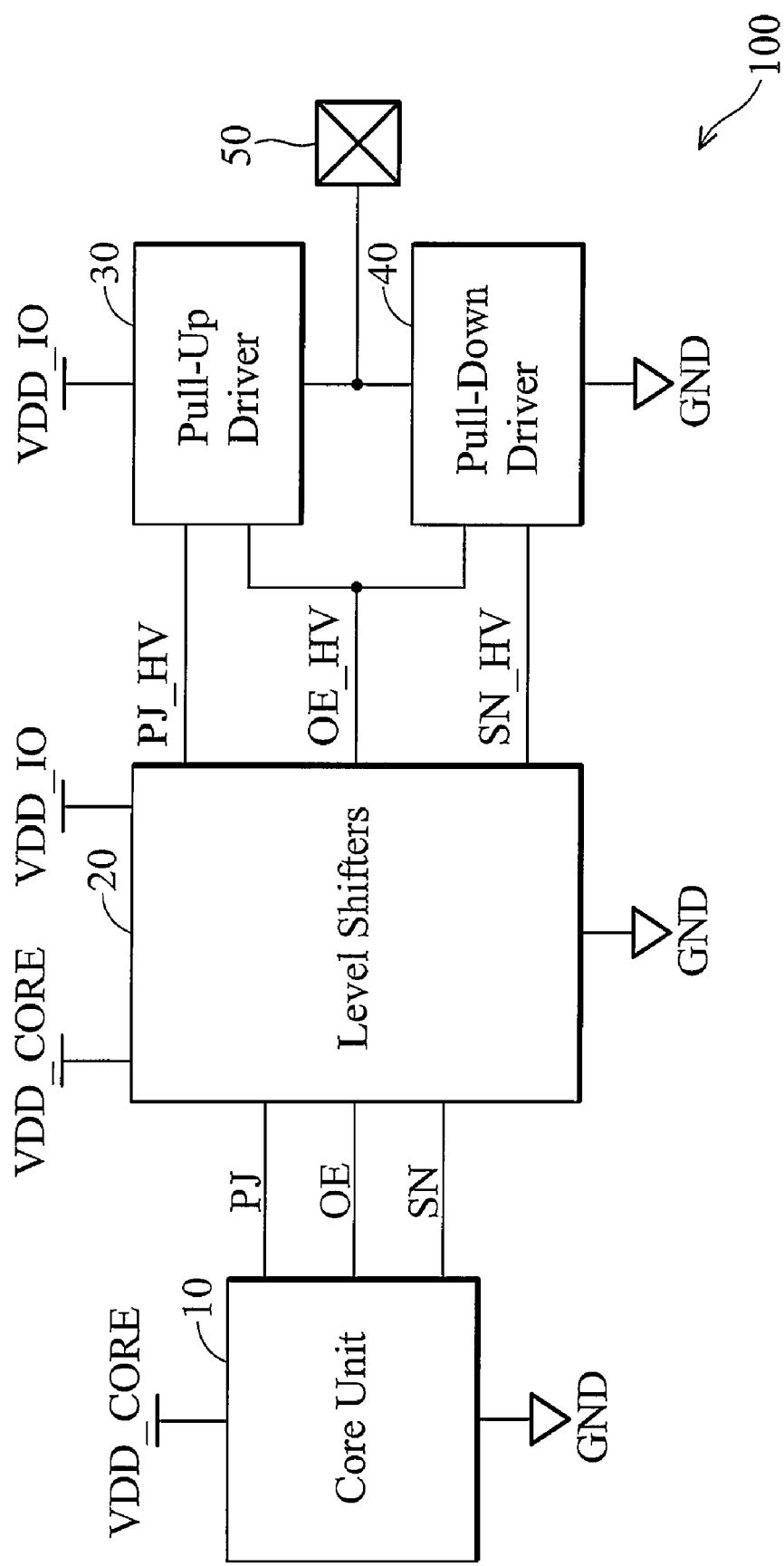
FIG. 1 shows an embodiment of an output buffer.

FIG. 1 shows an embodiment of an output buffer. As shown, an output buffer 100 comprises a core unit 10 powered by a core power voltage VDD_CORE, a plurality of level shifters 20 powered by the core power voltage VDD_CORE and an I/O power voltage VDD_IO, a pull-up driver 30 powered by the I/O power voltage VDD_IO and a pull-down driver 40 coupled to a ground voltage GND. For example, the core unit 10 generates control signals PJ, OE, and SN according to an output enabling signal and outputs data (not shown) to the level shifters 20. The level shifters 20 level shift the control signals PJ, OE, and SN to signals PJ_HV, OE_HV, and SN_HV. The pull-up driver 30 and the pull-down driver 40 determine logic state of a pad 50. For example, according to the signals PJ_HV, OE_HV, and SN_HV output from the level shifters 20, the pad 50 can be pulled to the I/O power voltage VDD_IO by the pull-up driver 30 or pulled to the ground voltage GND by the pull-down driver 40.

Figure 2:
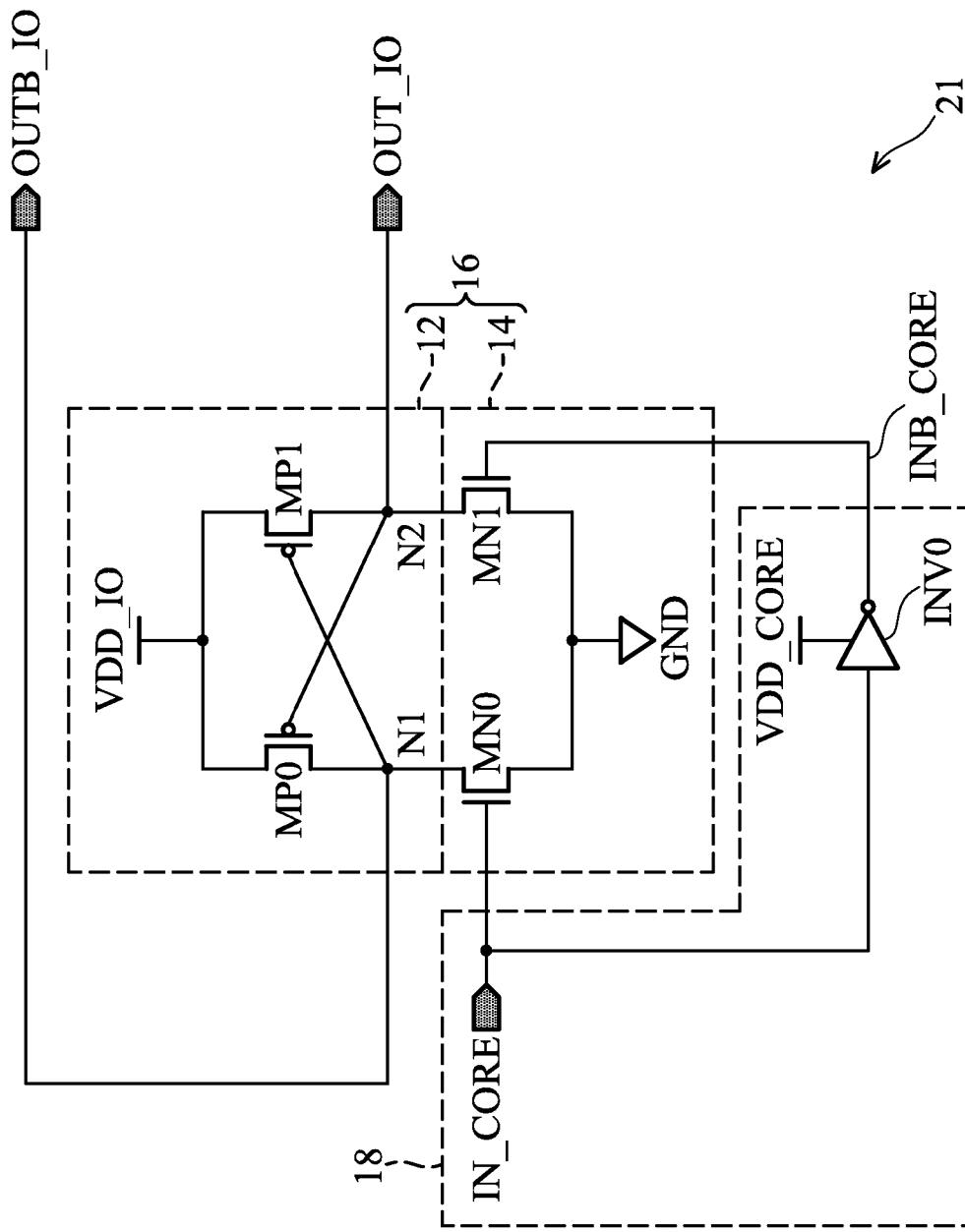
FIG. 2 shows an embodiment of a level shifter.

FIG. 2 shows an embodiment of a level shifter. As shown, a level shifter 21 generates output signals OUT_IO and OUT-B_IO according to an input signal IN_CORE. The level shifter 21 comprises first logic unit 16 powered by the I/O power voltage VDD_IO and a second logic unit 18 powered by the core power voltage VDD_CORE. For example, the first logic unit 16 can comprise a latch unit 12 having two cross-coupled PMOS transistors MP0 and MP1 and a differential pair 14 having two NMOS transistors MN0 and MN1, and the second logic unit 18 comprises an inverter INV0. In some embodiments, the latch unit 12 can also comprise two cross-coupled inverters. The inverter INV0 powered by the core power voltage VDD_CORE converts the input signal IN_CORE to an inverse signal INB_CORE. As the input signal IN_CORE goes high, the inverse signal INB_CORE goes low and the NMOS transistors MN0 and MN1 are turned on and off respectively. As NMOS transistor MN0 is turned on, the gate terminal of the PMOS transistor MP1 is pulled to the ground voltage GND and the PMOS transistor MP1 is then turned on. Thus, the output signals OUT_IO and OUTB_IO go high and low respectively. In this case, the nodes N1 and N2 can be regarded as output terminals outputting the output signals OUTB_IO and OUT_IO.

Figure 3:
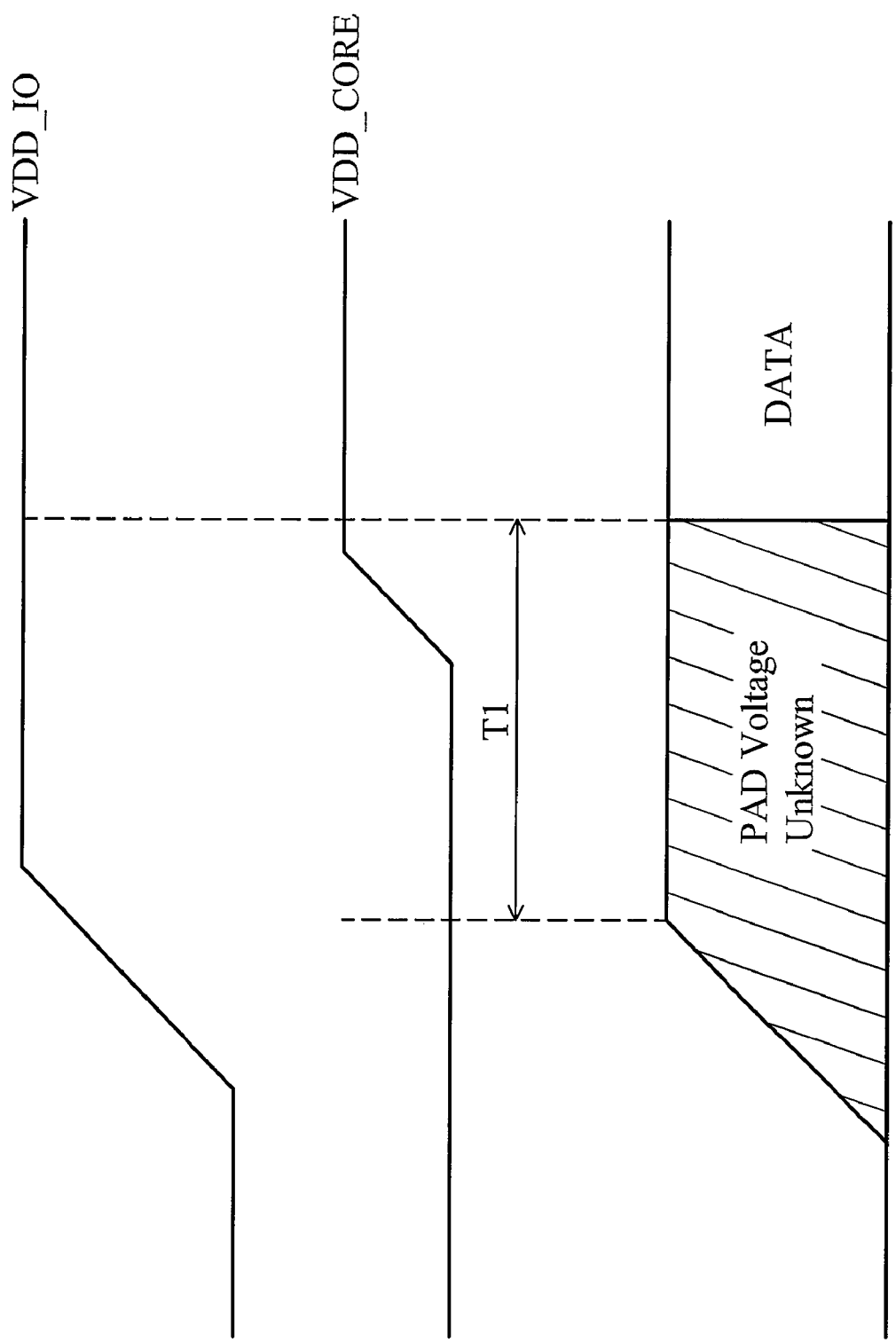
FIG. 3 shows a relationship between the I/O power voltage VDD_IO and the core power voltage VDD_CORE applied to the level shifter shown in FIG. 2.

However, when the input/output power voltage VDD_IO is ready before the core power voltage VDD_CORE as shown in FIG. 3, the input signal IN_CORE generated based on the core power voltage VDD_CORE is not available during time interval T1, such that the NMOS transistors MN0 and MN1 remain off and the output signals OUT_IO and OUTB_IO are unknown. As logic level of the output signal, from the level shifters 20, controlling the pull-up driver 30 and the pull-down driver 40 are unknown during time interval T1, the voltage level at the pad 50 is unknown accordingly. This situation can potentially cause data contention or abnormal operations to generate permanent damage or burnout.

To prevent this situation, the invention further provides other embodiments of a level shifter capable of setting logic level of the output signals thereof to a pre-defined known state during power-up.

Figure 4:
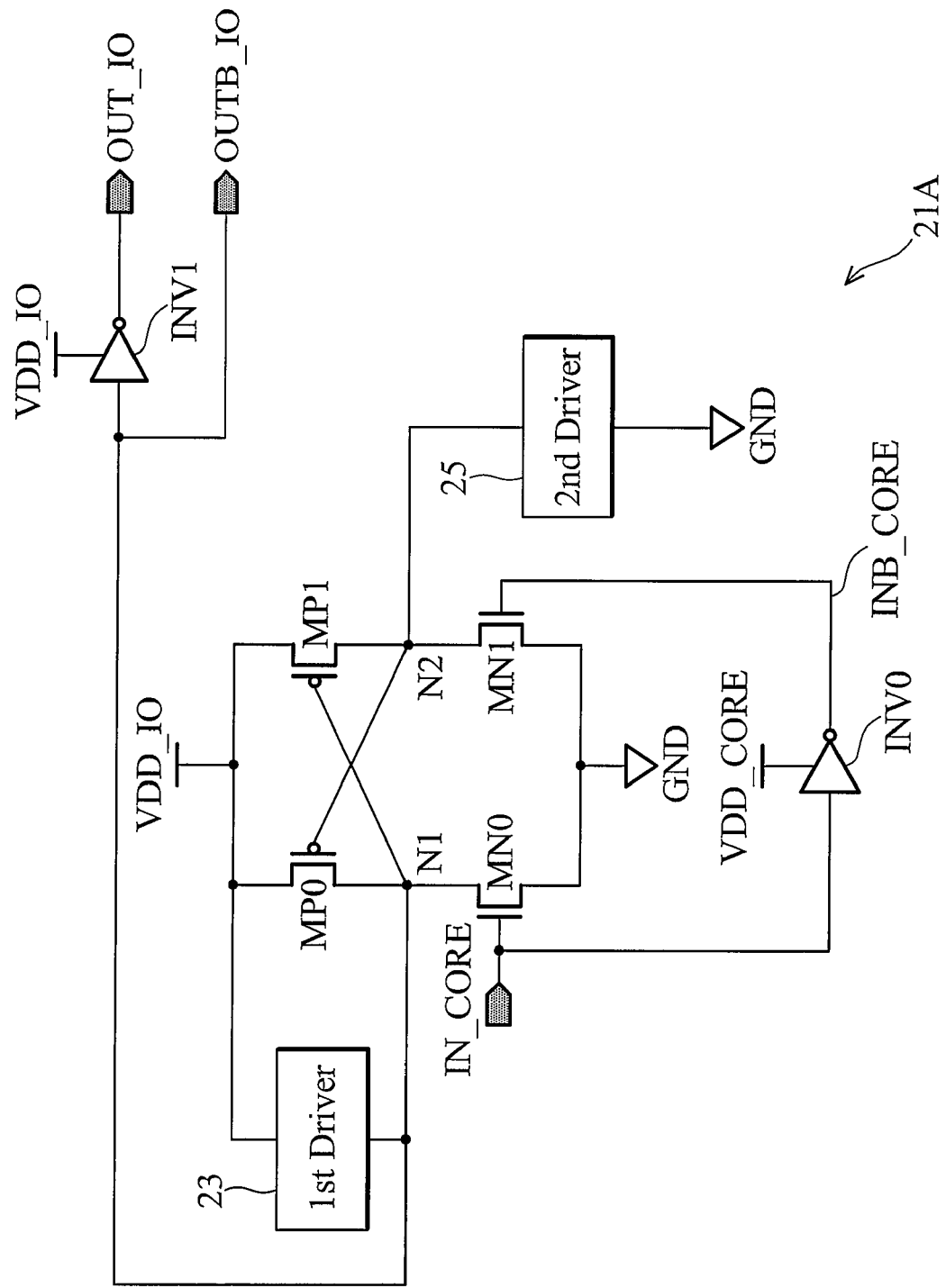
FIG. 4 shows another embodiment of a level shifter.

FIG. 4 shows another embodiment of a level shifter. As shown, a level shifter 21A is powered by the I/O power voltage VDD_IO and the core power voltage VDD_CORE and comprises the cross-coupled PMOS transistors MP0 and MP1, the two NMOS transistors MN0 and MN1 and the inverter INV0 and first and second drivers 23 and 25. The PMOS transistor MP0 comprises a source terminal coupled to the I/O power voltage VDD_IO, a drain terminal coupled to a node N1 and a gate terminal coupled to a node N2. The PMOS transistor MP1 comprises a source terminal coupled to the I/O power voltage VDD_IO, a drain terminal coupled to the node N2 and a gate terminal coupled to the node N1. The NMOS transistor MN0 comprises a source terminal coupled to the ground voltage GND, a drain terminal coupled to the node N1 and a gate terminal coupled to the input signal IN_CORE, for example, from the core unit 10. The NMOS transistor MN1 comprises a source terminal coupled to the ground voltage GND, a drain terminal coupled to the node N2, and a gate terminal.

The inverter INV0 is powered by the core power voltage VDD_CORE to convert the input signal IN_CORE to an inverse signal INB_CORE, and the inverter INV1 is powered by the I/O power voltage VDD_IO to convert the output signal OUTB_IO to an inverse signal OUT_IO. The first driver 23 is coupled between the I/O power voltage VDD_IO and the node N1, matching the voltage at the node N1 with the I/O power voltage VDD_IO when the core power voltage VDD_CORE is not ready, and the second driver 25 is coupled between the ground voltage GND and the node N2, pulling the voltage at the node N2 low (or remain low) when the core power voltage VDD_CORE.

Hence, during power-up, the voltage level at the node N1 follows the I/O power voltage VDD_IO and the voltage level at the node N2 goes low (or remain low) even if the NMOS transistors MN0 and MN1 maintain off because the input/output power voltage VDD_IO is ready before the core power voltage VDD_CORE. Namely, the output signals OUTB_IO and OUT_IO can be set at predetermined states respectively when the core power voltage VDD_CORE is not ready. Thus, the described data contention, abnormal operation, permanent damage or burnout can be prevented. When the core power voltage VDD_CORE is ready, the inverter INV0 with core power voltage VDD_CORE outputs an inverse signal and regains control of this level shifter. Namely, the NMOS transistors MN0 and MN1 are controlled by the input signal IN_CORE and the inverse signal INB_CORE regardless of the first and second drivers 23 and 25. In some examples, one of the first driver 23 and the second driver 25 can be omitted.

Figure 5:
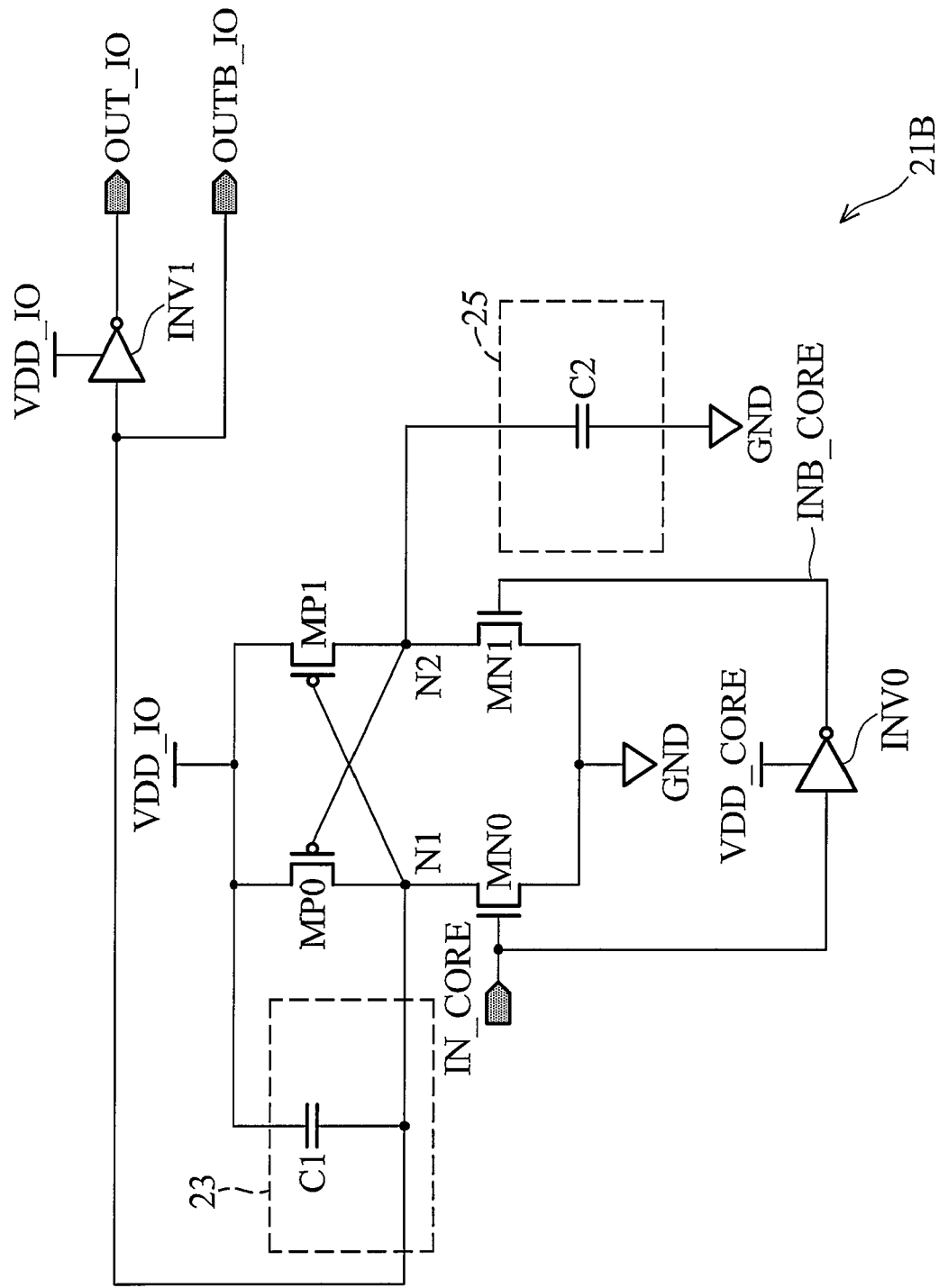
FIG. 5 shows another embodiment of a level shifter.

FIG. 5 shows another embodiment of a level shifter. As shown, the level shifter 21B is similar to the level shifter 21A shown in FIG. 4, differing only in that the first driver 23 and the second driver 25 are implemented by capacitors C1 and C2 respectively. For example, the capacitors C1 and C2 can be varactors, metal-oxide-metal (MOM) capacitors or metal-insulation-metal (MIM) capacitors but are not limited thereto. In this case, due to AC coupling of the capacitor C1, the voltage level at the node N1 follows the I/O power voltage VDD_IO, and the voltage level at the node N2 remains low because of the capacitor C2. Namely, the output signals OUTB_IO and OUT_IO are set at high and low respectively when the core power voltage VDD_CORE is not ready during power-up.

Figure 6:
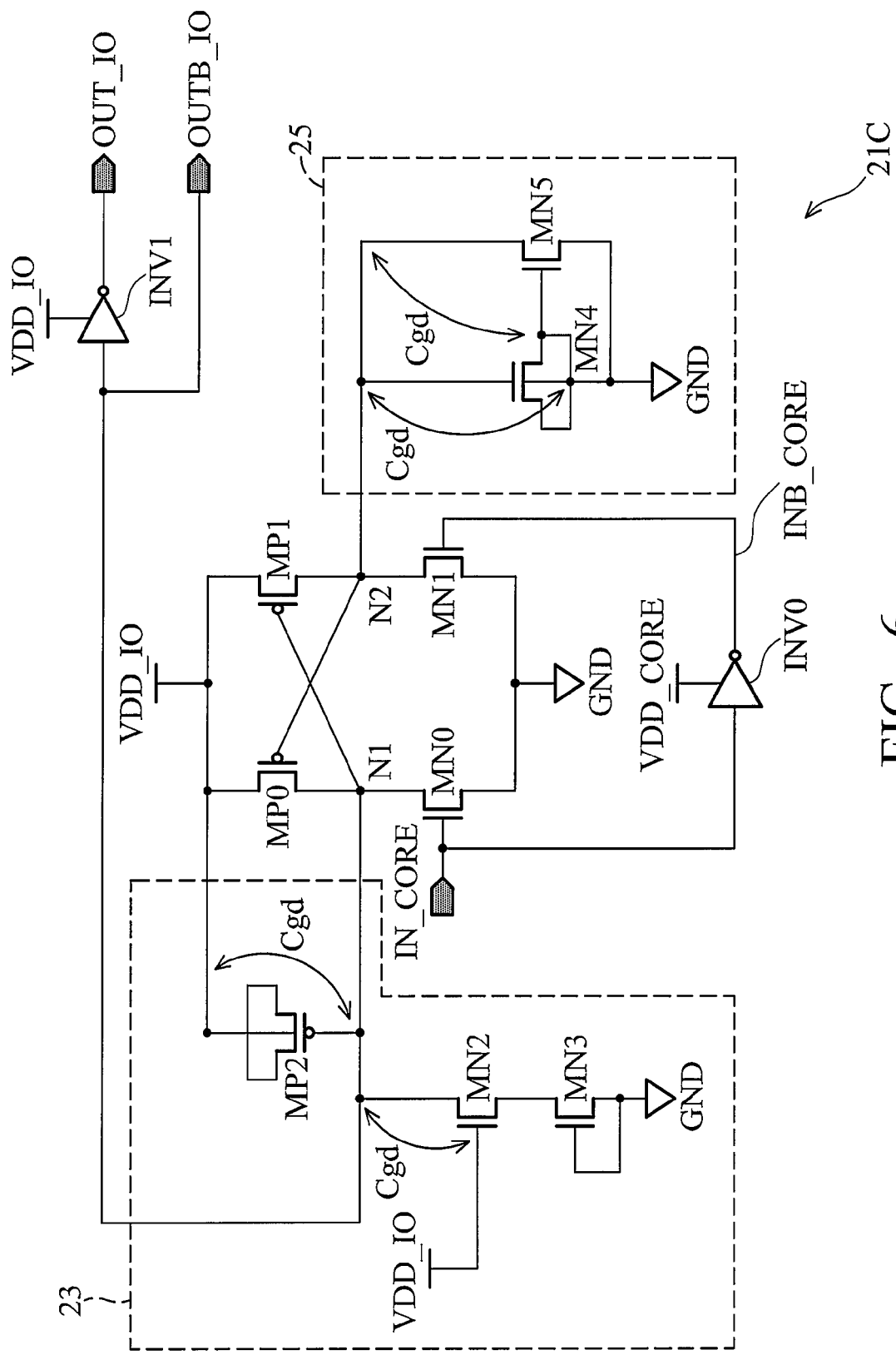
FIG. 6 shows another embodiment of a level shifter.

FIG. 6 shows another embodiment of a level shifter. As shown, the level shifter 21C is similar to the level shifter 21A shown in FIG. 4, differing only in that the first driver 23 is implemented by the PMOS transistor MP2 and NMOS transistors MN2 and MN3 and the second driver 25 is implemented by the NMOS transistors MN4 and MN5. The PMOS transistor MP2 comprises drain and source terminals coupled to the I/O power voltage VDD_IO and a gate terminal coupled to the node N1, i.e., the PMOS transistor MP2 is connected as a capacitor. The NMOS transistor MN2 comprises a drain terminal coupled to the node N1, a gate coupled to the I/O power voltage VDD_IO and a source terminal. In some embodiments, the level shifter 21C can comprise the first driver 23 without the second driver 25.

The NMOS transistor MN3 comprises a drain terminal coupled to the source terminal of the NMOS transistor MN2, and a gate terminal and a source terminal both coupled to the ground voltage GND. The NMOS transistor MN4 comprises a gate terminal coupled to the node N2, and a source terminal and a drain terminal both coupled to the ground voltage GND, i.e., the NMOS transistor MN4 is connected as a capacitor. The NMOS transistor MN5 comprises a drain terminal coupled to the node N2, and a gate terminal and a source terminal both coupled to the ground voltage GND. Namely, the NMOS transistors MN4 and MN5 can be regarded as decoupling capacitors.

Because of parasitical capacitors Cgd or Cgb, the voltage level at the node N1 follows the I/O power voltage VDD_IO while the voltage level at the node N2 remains low because of the decoupling capacitors, i.e., the NMOS transistors MN4 and MN5. Hence, the output signals OUTB_IO and OUT_IO are set at high and low respectively when the core power voltage VDD_CORE is not ready during power-up. In some embodiments, the first driver 23 can comprise the NMOS transistors MN2 and MN3 without the PMOS transistor MP2. In some embodiments, the first driver 23 can comprise the PMOS transistor MP2 without the NMOS transistors MN2 and MN3. In some embodiments, the second driver 25 can comprise the NMOS transistors MN4 without the NMOS transistor MN5. In some embodiments, the second driver 25 can comprise the NMOS transistors MN5 without the NMOS transistor MN4.

Figure 7:
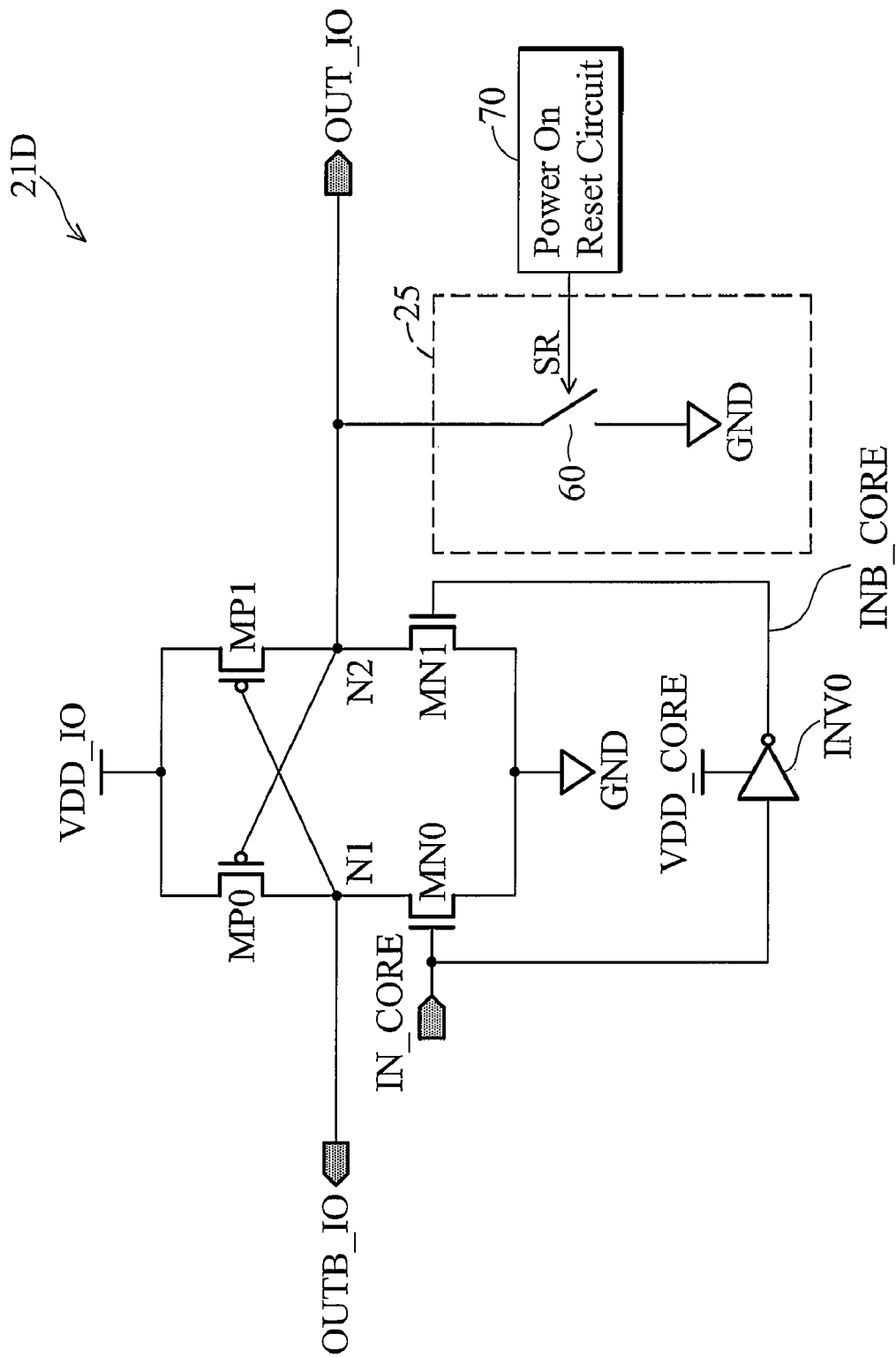
FIG. 7 shows another embodiment of a level shifter.

FIG. 7 shows another embodiment of a level shifter. As shown, the level shifter 21D is similar to the level shifter 21A shown in FIG. 4, differing only in that the first driver 23 is omitted and the second driver 25 is implemented by a switching element 60. The switching element 60 is coupled between the node N2 and the ground voltage GND and controlled by an external power on reset circuit 70. The external power on reset circuit 70 generates a control signal SR to control the switching element 60, such that the voltage level at the node N2 can be pulled low when the core power voltage VDD_CORE is not ready during power-up. As the node N2 is pulled low by the switching element 60, the PMOS transistor MP0 is turned on and the node N1 is pulled to the I/O power voltage VDD_IO. Namely, the output signals OUTB_IO and OUT_IO are set to high and low respectively when the core power voltage VDD_CORE is not ready.

When the core power voltage VDD_CORE is ready, the power on reset circuit 70 turns off the switching element 60 by the control signal SR, such that the inverter INV0 with core power voltage VDD_CORE outputs an inverse signal and regains control of this level shifter 21D. In some embodiments, the switching element 60 can be implemented by an active element, such as MOS transistors, bipolar junction transistors (BJTs), field effect transistor (FETs) or combination thereof.

Figure 8:
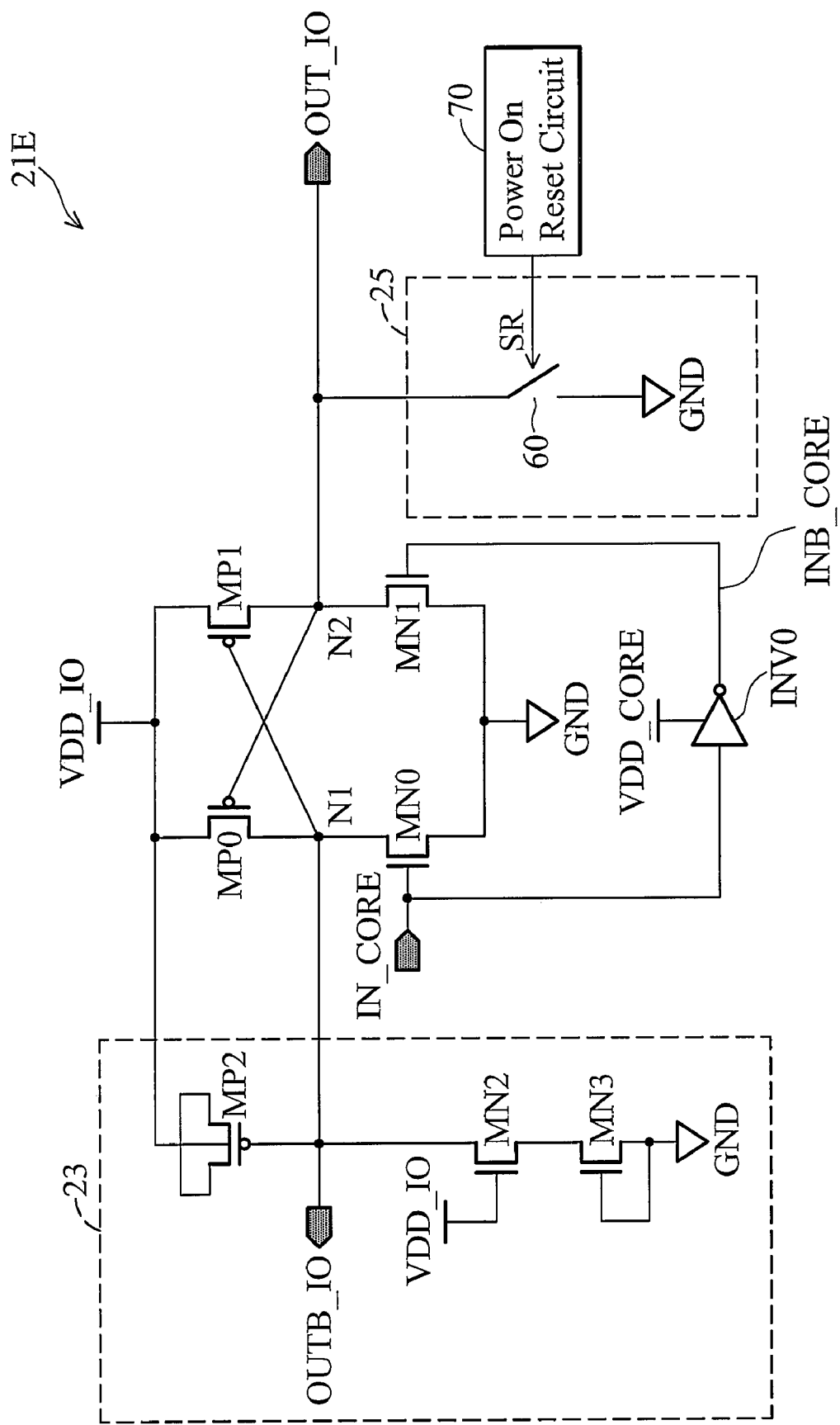
FIG. 8 shows another embodiment of a level shifter.

FIG. 8 shows another embodiment of a level shifter. As shown, the level shifter 21E is similar to the level shifter 21C shown in FIG. 6, differing only in that the second driver 25 is implemented by a switching element 60. During power-on, when the core power voltage VDD_CORE is not ready, the voltage level at the node N1 follows the I/O power voltage VDD_IO because of AC coupling caused by the parasitical capacitors Cgd or Cgb of the MOS transistors MP2, MN2 or MN3, and the voltage level at the node N2 is pulled low by the switching element 60. Namely, the output signals OUTB_IO and OUT_IO are set at high and low respectively when the core power voltage VDD_CORE is not ready during power-up. When the core power voltage VDD_CORE is ready, the external power on reset circuit 70 turns off the switching element 60 by the control signal SR, such that the inverter INV0 with core power voltage VDD_CORE outputs an inverse signal and regains control of this level shifter 21E.

Figure 9:
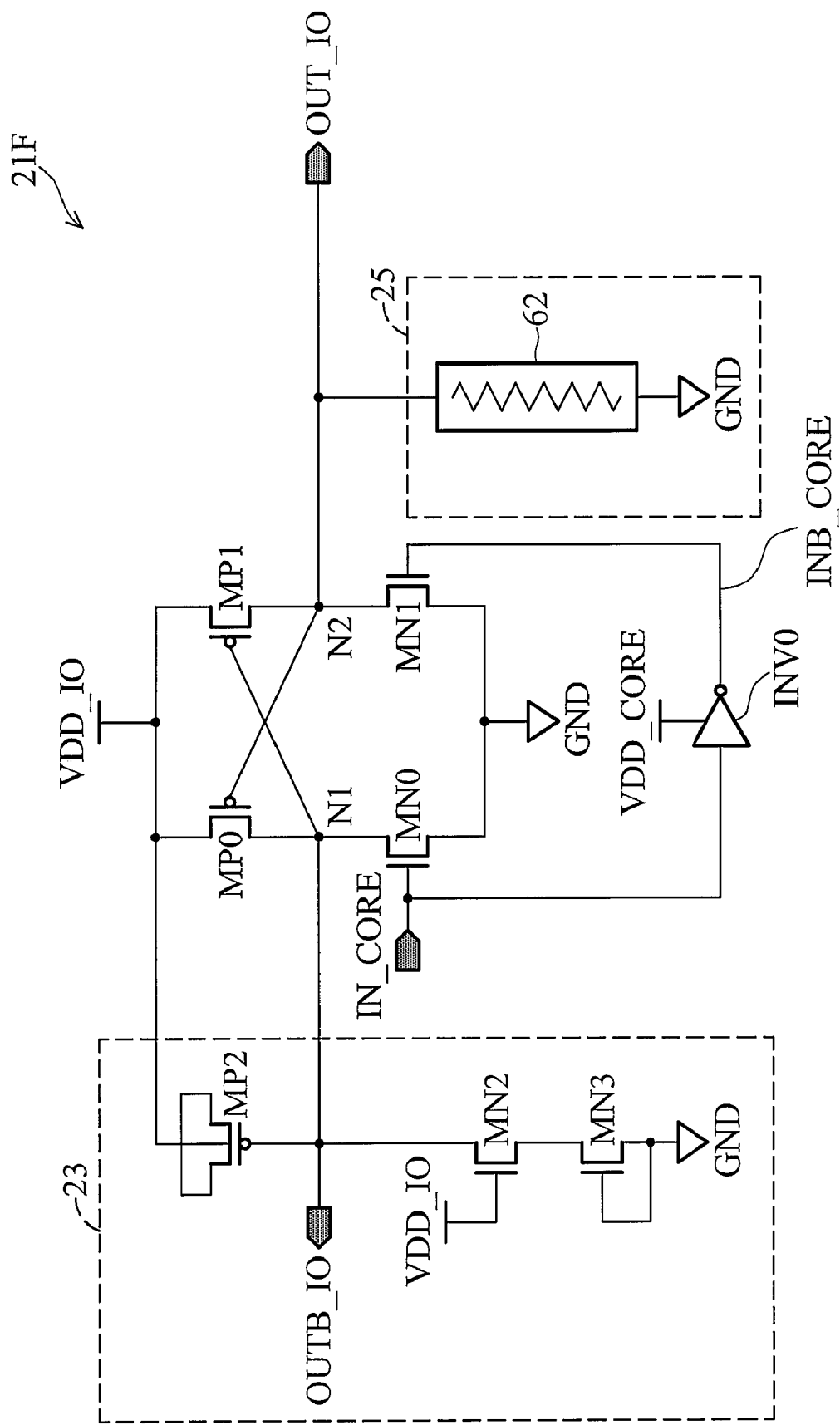
FIG. 9 shows another embodiment of a level shifter.

FIG. 9 shows another embodiment of a level shifter. As shown, the level shifter 21F is similar to the level shifter 21C shown in FIG. 6, differing only in that the second driver 25 is implemented by a resistive element 62 pulling low the voltage level of the node N2 slowly. During power-on, when the core power voltage VDD_CORE is not ready, the voltage level at the node N1 follows the I/O power voltage VDD_IO because of AC coupling caused by the parasitical capacitors Cgd or Cgb of the MOS transistors MP2, MN2 or MN3 while the voltage level at the node N2 is pulled low by the resistive element 62 slowly. Namely, the output signals OUTB_IO and OUT_IO are set at high and low respectively when the core power voltage VDD_CORE is not ready during power-up. For example, if the resistive element 62 has a sufficient resistance, it can also be regarded as a high impedance when the core power voltage VDD_CORE is ready. Hence, the inverter INV0 with core power voltage VDD_CORE outputs an inverse signal and regains control of level shifter 21F when the core power voltage VDD_CORE is ready.

Figure 10B:
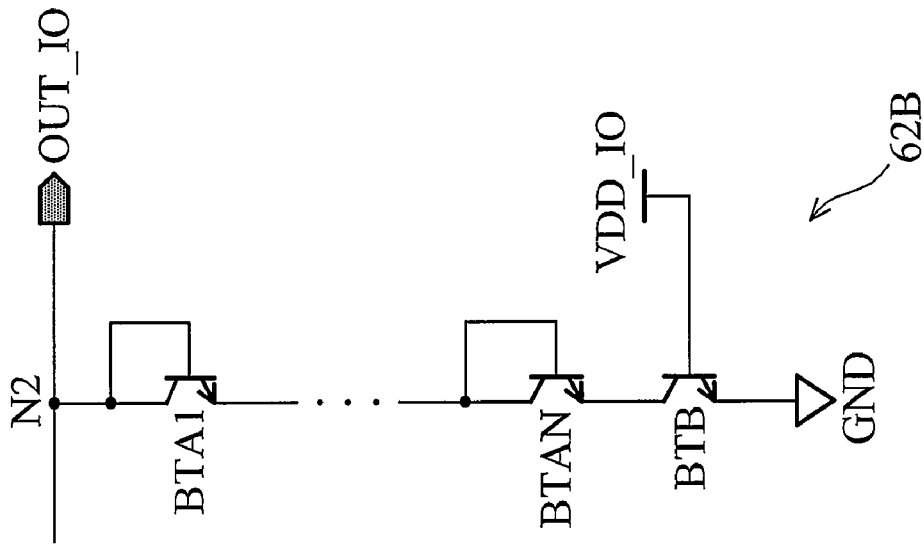
FIG. 10B shows another embodiment of a resistive element.
Figure 10A:
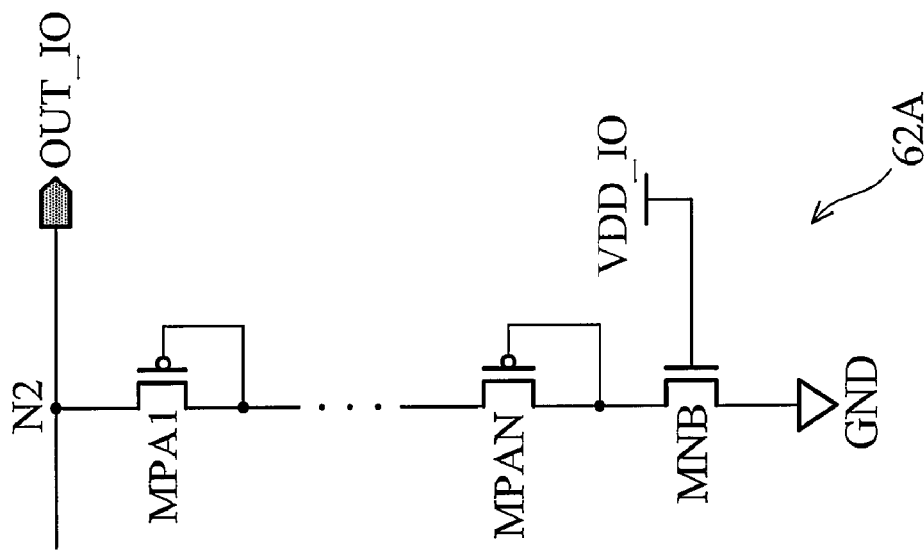
FIG. 10A shows an embodiment of a resistive element.

FIG. 10A shows an embodiment of a resistive element. As shown, a resistive element 60B is coupled between the node N2 and the ground voltage GND and comprises N PMOS transistors MPA1~MPAN connected in series and a NMOS transistor MNB coupled between the NMOS transistors MPA1~MPAN and the ground voltage GND. The NMOS transistors MPA1~MPAN are each connected as a diode form, i.e., gate terminal is coupled to the source terminal thereof. When the I/O power voltage VDD_IO is ready during power-up, the NMOS transistor MNB is turned on, such the voltage level at the node N2 is pulled low slowly. Hence, when the I/O power voltage VDD_IO is ready prior to the core power voltage VDD_CORE, the output signal OUTB_IO is pulled high by the first driver 23 and the output signal OUT_IO is pulled low slowly by the resistive element 62A.

FIG. 10B shows another embodiment of a resistive element. As shown, the resistive element 62B is similar to the resistive element 62A shown in FIG. 10A, differing only in that the PMOS transistors MPA1~MPAN are replaced by bipolar junction transistors BTA1~BTAN. Operations of the resistive element 62B are similar to those of the resistive element 62A shown in FIG. 10A, and thus are omitted for simplification.

Figure 10D:
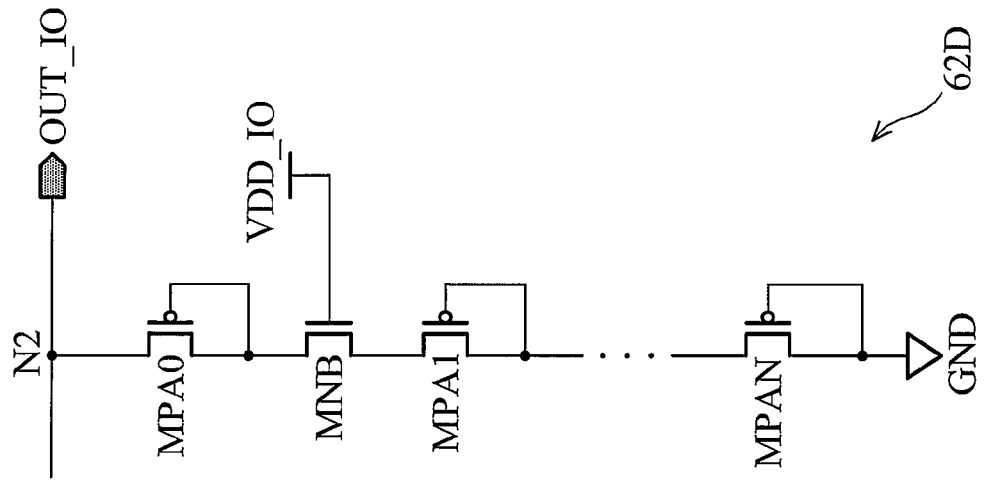
FIG. 10D shows another embodiment of a resistive element.
Figure 10C:
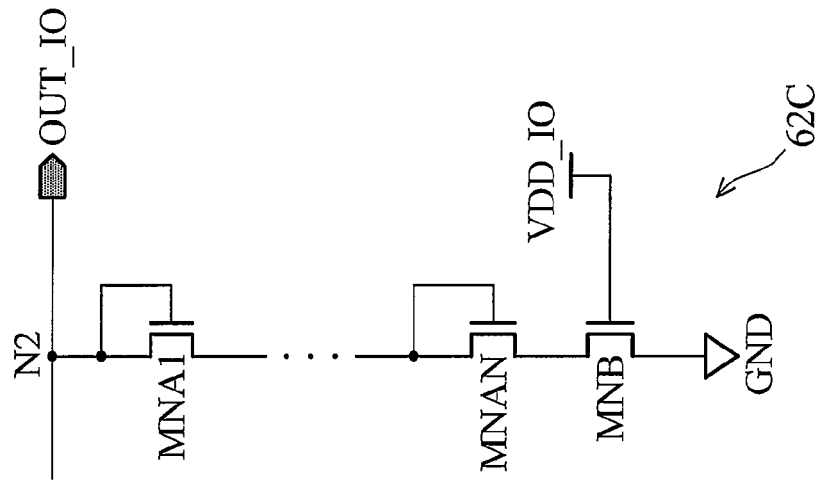
FIG. 10C shows another embodiment of a resistive element.

FIG. 10C shows another embodiment of a resistive element. As shown, the resistive element 62C is similar to the resistive element 62A shown in FIG. 10A, differing only in that the PMOS transistors MPA1~MPAN are replaced by NMOS transistors MNA1~MNAN. The NMOS transistors MNA1~MNAN each is connected as a diode form, i.e., its gate terminal coupled to the drain terminal thereof. Operations of the resistive element 62C are similar to those of the resistive element 62A shown in FIG. 10A, and thus are omitted for simplification.

FIG. 10D shows another embodiment of a resistive element. As shown, the resistive element 62D is similar to the resistive element 62A shown in FIG. 10A, differing only in that the NMOS transistor MNB is coupled between PMOS transistors MPA1~MPAN and MPA0. Operations of the resistive element 62D are similar to those of the resistive element 62A shown in FIG. 10A, and thus are omitted for simplification.

Figure 11:
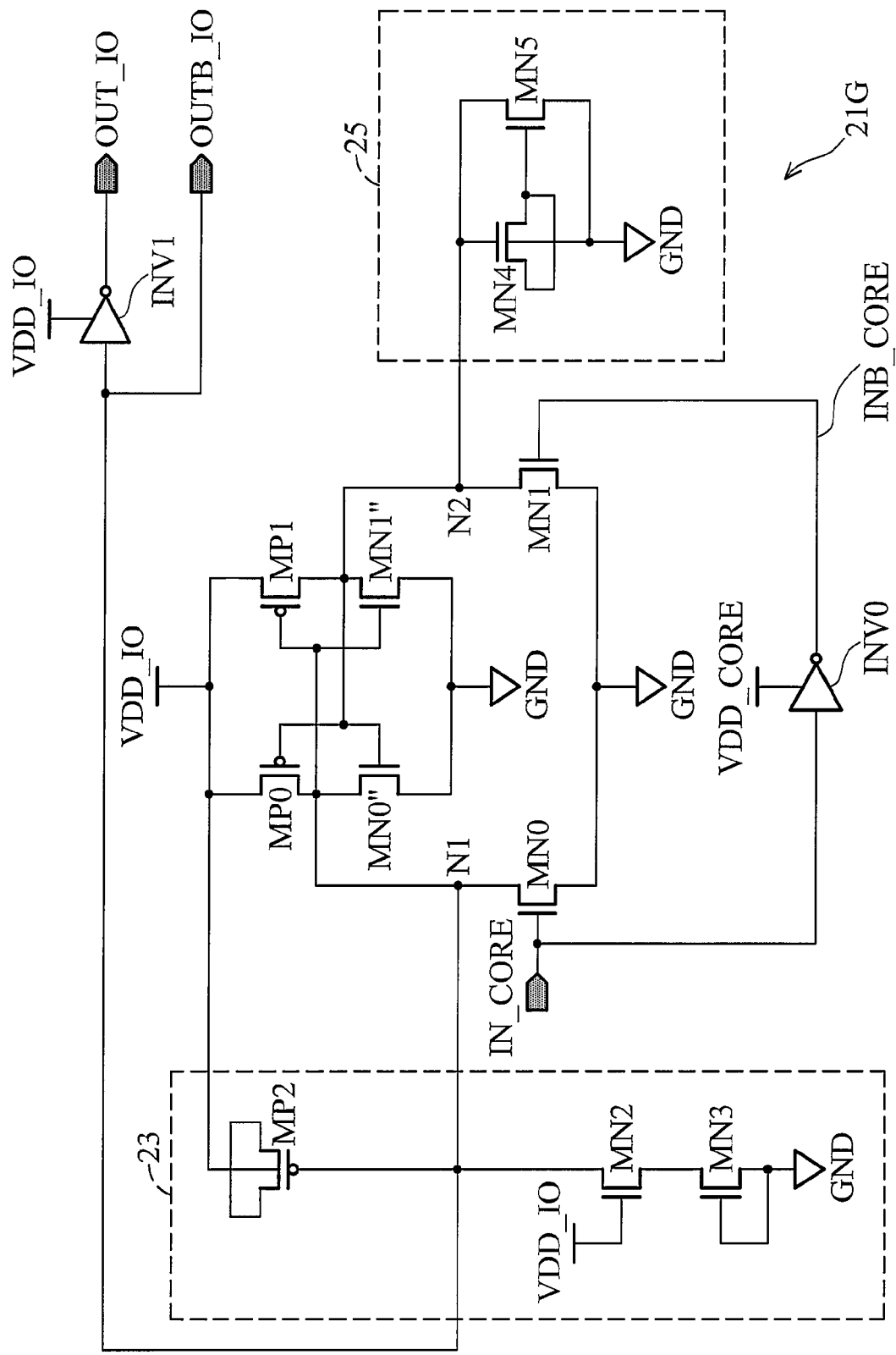
FIG. 11 shows another embodiment of a level shifter.

FIG. 11 shows another embodiment of a level shifter. As shown, the level shifter 21 G is similar to the level shifter 21C shown in FIG. 6, differing only in that the NMOS transistors MN0" and MN1" are added. The NMOS transistor MN0" comprises a drain coupled to the node N1, a source terminal coupled to the ground voltage GND and a gate terminal coupled to the node N2. The NMOS transistor MN1" comprises a drain coupled to the node N2, a source terminal coupled to the ground voltage GND and a gate terminal coupled to the node N1. The PMOS transistors MP0 and MP1 and the NMOS transistors MN0" and MN1" form a latch comprising two cross-coupled inverters. Operations of the level shifter 21G are similar to those of the level shifter 21C shown in FIG. 6, and thus are omitted for simplification.

Figure 12:
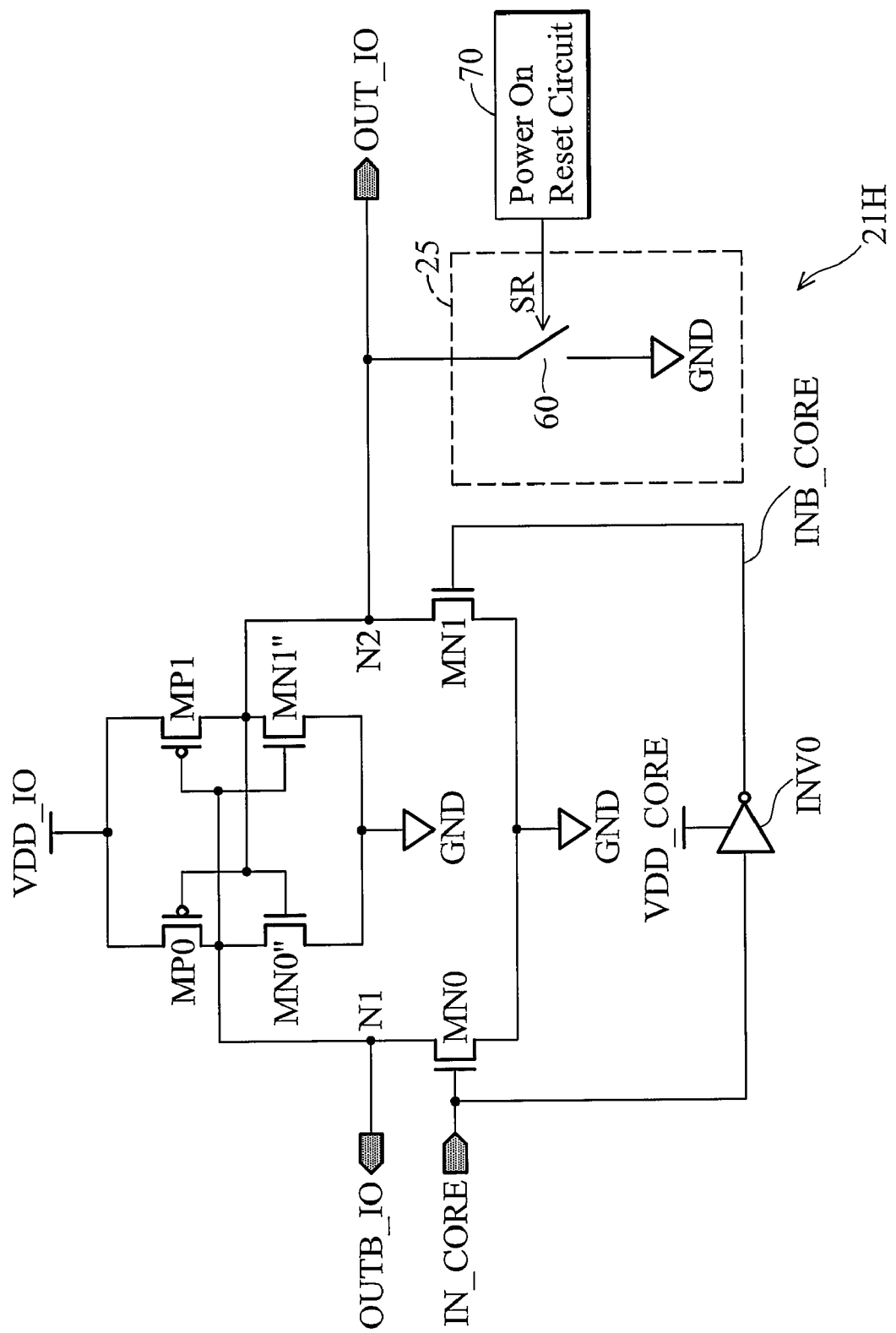
FIG. 12 shows another embodiment of a level shifter.
Figure 13:
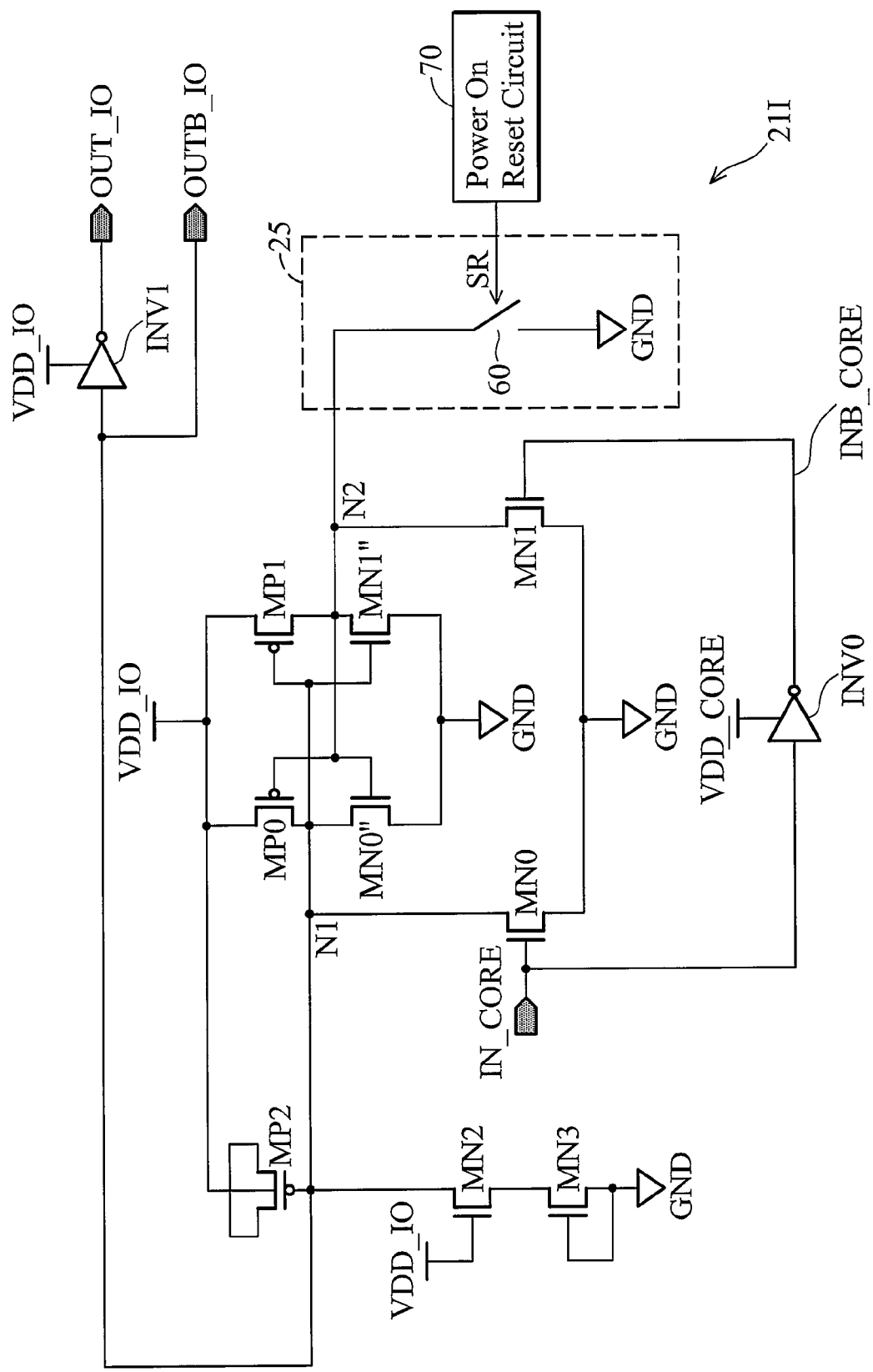
FIG. 13 shows another embodiment of a level shifter.

FIGS. 12 and 13 show further embodiments of a level shifter. As shown, the level shifters 21H and 21I are similar to the level shifters 21D and 21E shown in FIGS. 7 and 8 respectively, differing only in that the PMOS transistors MP0 and MP1 and the NMOS transistors MN0" and MN1" form a latch comprising two cross-coupled inverters. Operations of the level shifters 21H and 21I are similar to those of the level shifters 21D and 21E shown in FIGS. 7 and 8, and thus are omitted for simplification.

Thus, the level shifters shown in FIGS. 4-9 and 11-13 can set the logic level of the output signals thereof when the core power voltage VDD_CORE is not ready during power-up, and the first and second drivers do not affect normal operations of the level shifters when the core power voltage VDD_CORE and the I/O power voltage VDD_IO are both ready.

Figure 14:
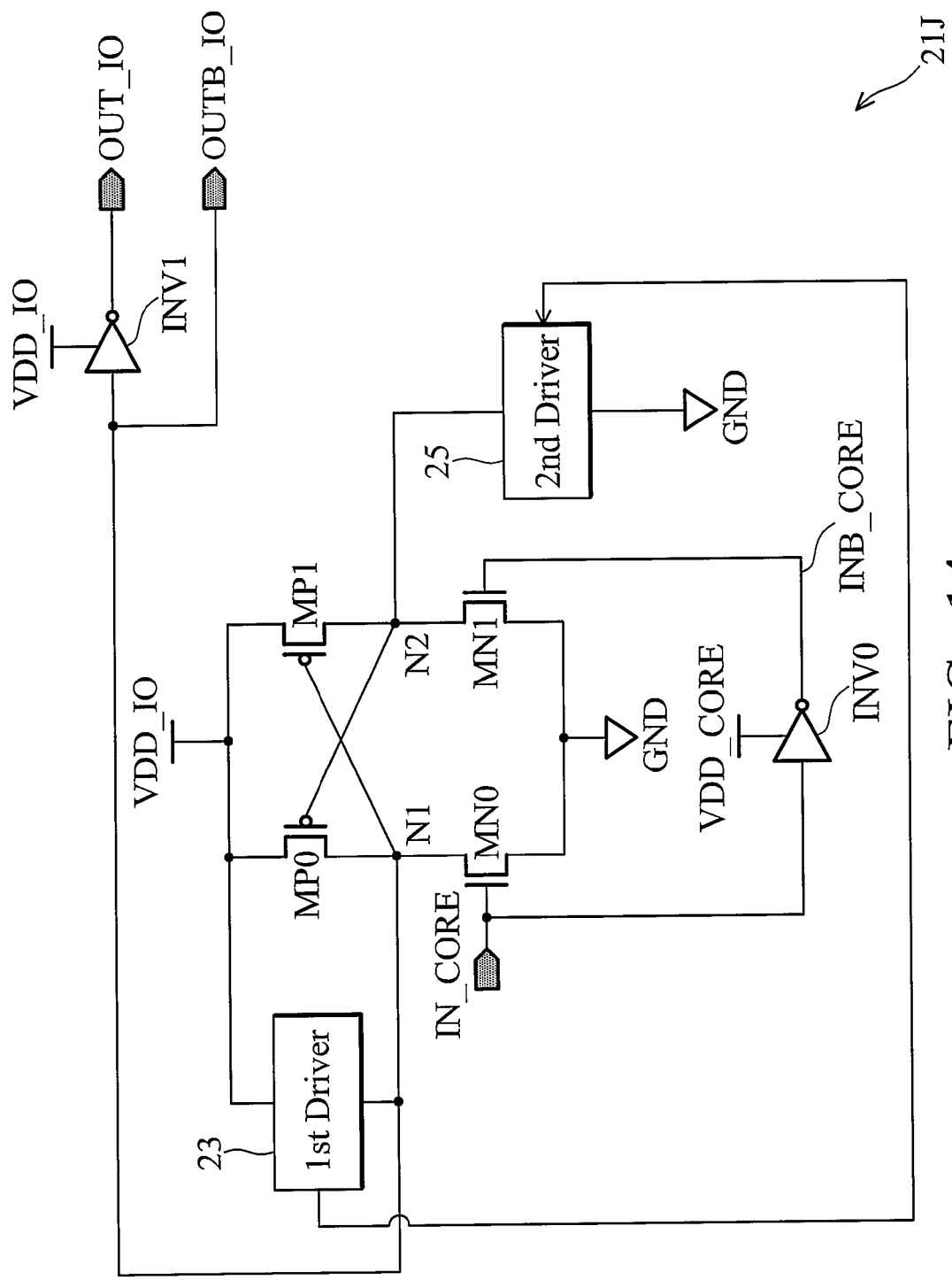
FIG. 14 shows another embodiment of a level shifter.

FIG. 14 shows another embodiment of a level shifter. As shown, the level shifter 21J is similar to the level shifter 21A shown in FIG. 4, differing only in that the second driver 25 is controlled by the first driver 23. When the core power voltage VDD_CORE is not ready, the first driver 23 matches the voltage at the node N1 with the I/O power voltage VDD_IO and enables the second driver 25 to pull the voltage at the node N2 low. Namely, the output signals OUTB_IO and OUT_IO are set to high and low respectively when the core power voltage VDD_CORE is not ready. When the core power voltage VDD_CORE is ready, the inverter INV0 with core power voltage VDD_CORE outputs an inverse signal and regains control of this level shifter. Namely, the NMOS transistors MN0 and MN1 are controlled by the input signal IN_CORE and the inverse signal INB_CORE regardless of the first and second drivers 23 and 25.

Figure 15:
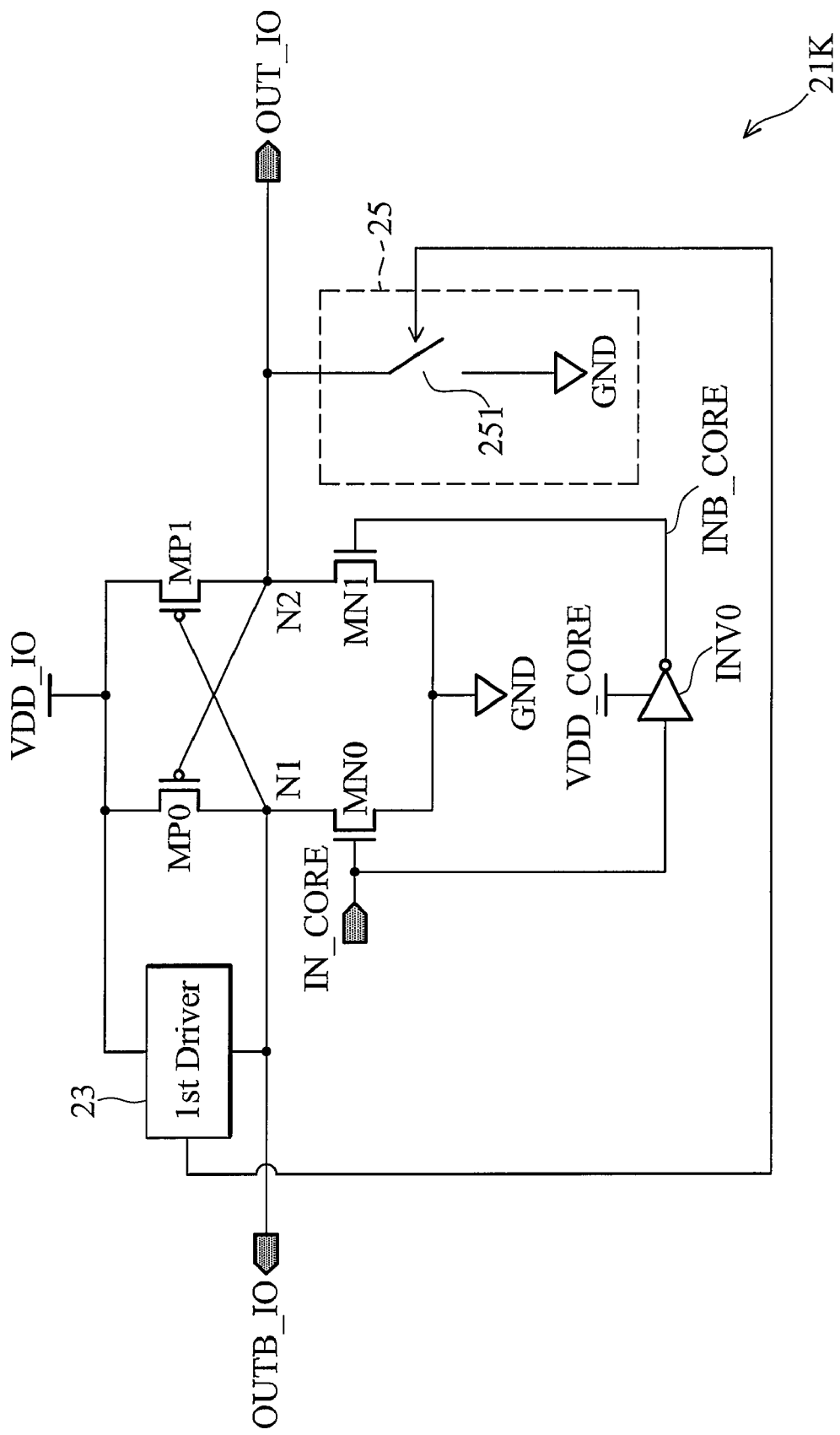
FIG. 15 shows another embodiment of a level shifter.

FIG. 15 shows another embodiment of a level shifter. As shown, the level shifter 21K is similar to the level shifter 21J shown in FIG. 14, differing only in that the second driver 25 is implemented by a switching element 251. For example, the switching element 251 can be implemented by an active element, such as MOS transistors, bipolar junction transistors (BJTs), field effect transistor (FETs) or combination thereof but are not limited thereto. In this case, when the core power voltage VDD_CORE is not ready during power-up, the first driver 23 matches the voltage at the node N1 with the I/O power voltage VDD_IO and outputs a signal to turn on the switching element 251, such that the voltage at the node N2 is pulled low to the ground voltage GND. Namely, the output signals OUTB_IO and OUT_IO are set at high and low respectively when the core power voltage VDD_CORE is not ready during power-up.

Figure 16:
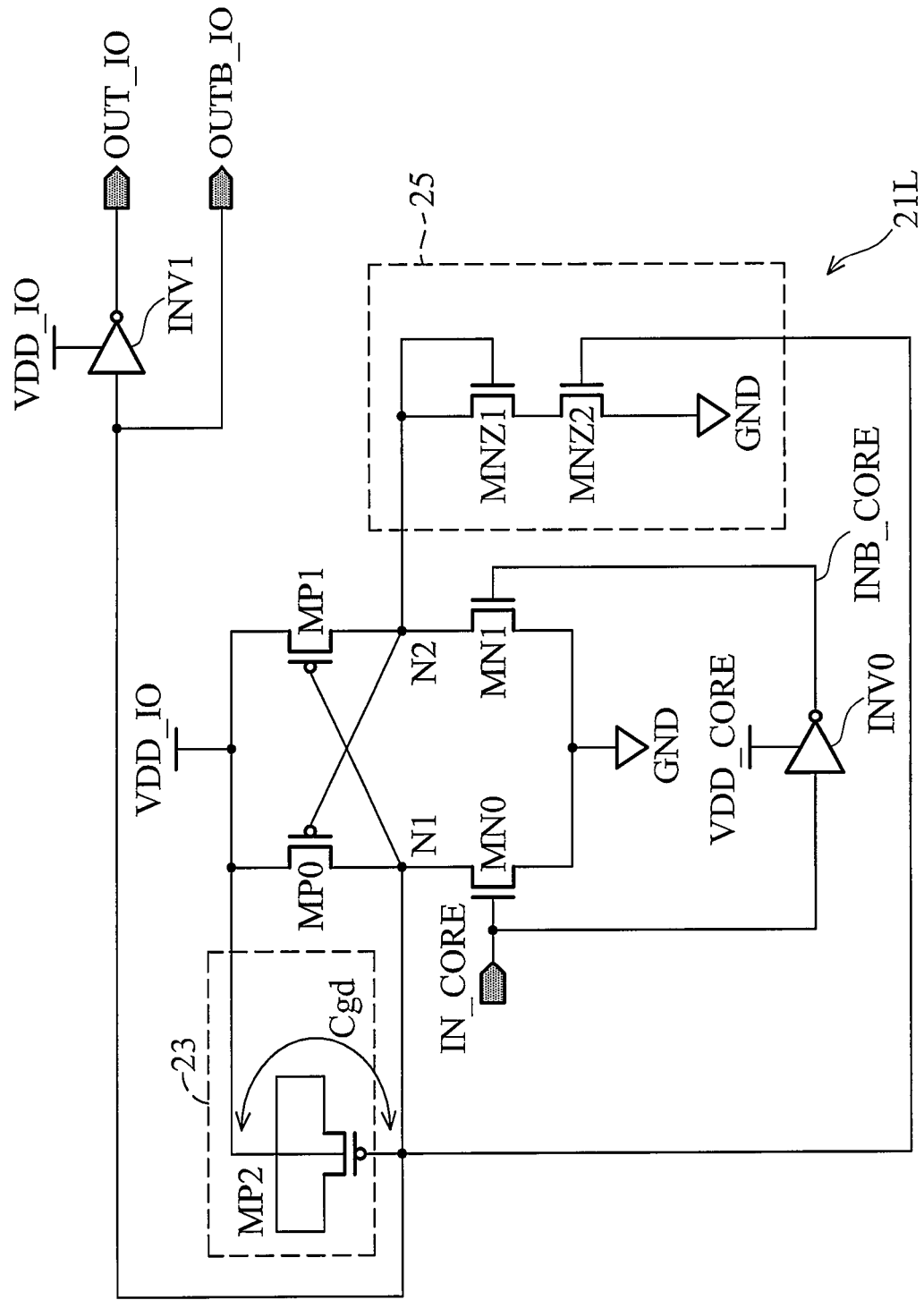
FIG. 16 shows another embodiment of a level shifter.

FIG. 16 shows another embodiment of a level shifter. As shown, the level shifter 21L is similar to the level shifter 21J shown in FIG. 14, differing only in that the first driver 23 is implemented by the PMOS transistor MP2 and the second driver 25 is implemented by two NMOS transistors MNZ1 and MNZ2. During power-on, when the core power voltage VDD_CORE is not ready, the voltage level at the node N1 follows the I/O power voltage VDD_IO because of AC coupling caused by the parasitical capacitors Cgd of the MOS transistor MP2, and the NMOS transistor MNZ2 is turned on accordingly to pull the voltage at the node N2 low. Namely, the output signals OUTB_IO and OUT_IO are set at high and low respectively when the core power voltage VDD_CORE is not ready during power-up. When the core power voltage VDD_CORE is ready, the NMOS transistor MNZ2 is controlled by the voltage at the node N1. For example, as the voltage at the node N1 is low (i.e., the output signal OUTB_IO is at low), the NMOS transistor MNZ2 is turned off to stop pulling low the node N2. Conversely, as the voltage at the node N1 is high (i.e., the output signal OUTB_IO is at high), the NMOS transistor MNZ2 is turned on to pull low the voltage at the node N2.

Figure 17:
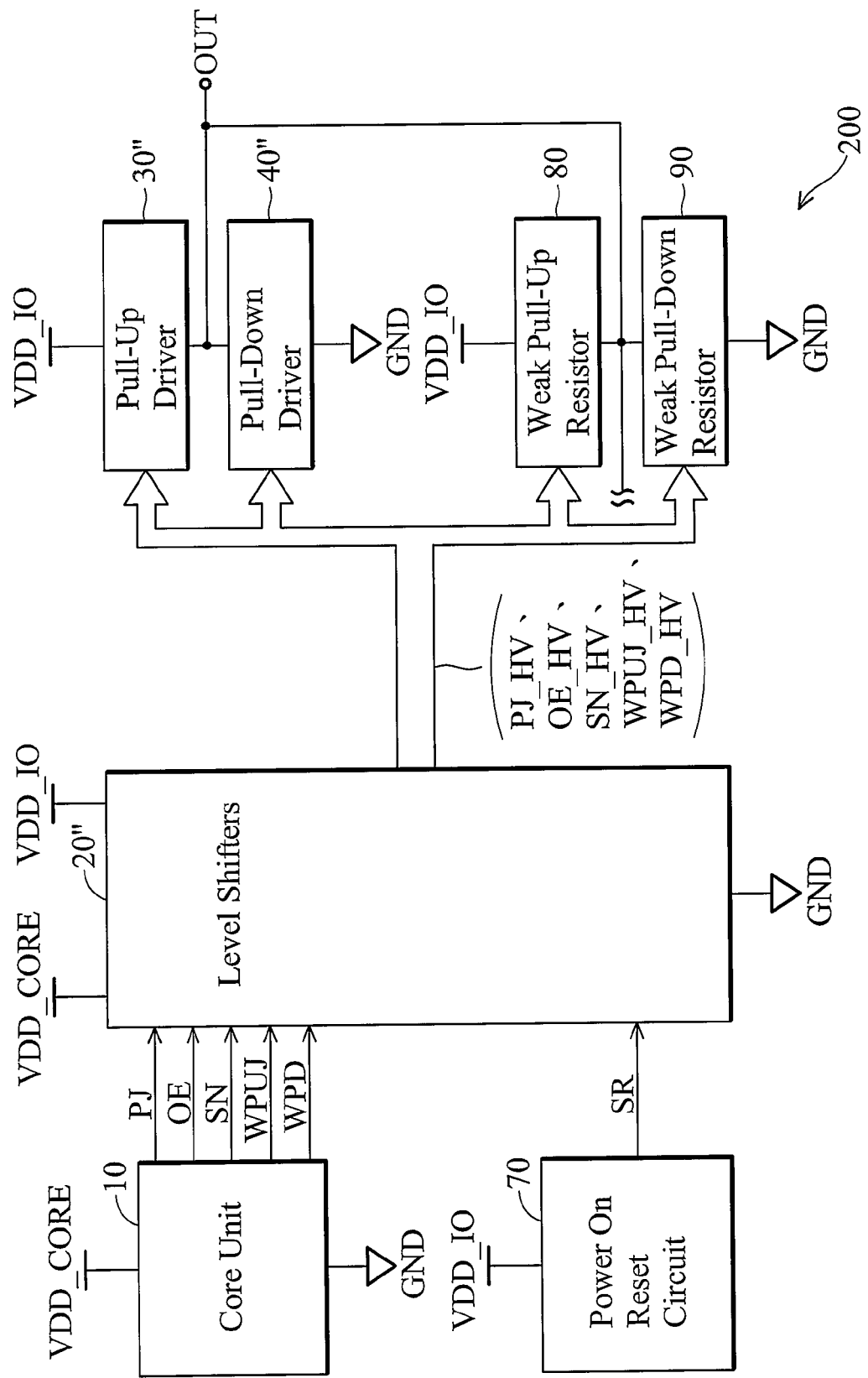
FIG. 17 shows an embodiment of an input/output (I/O) buffer.

FIG. 17 shows an embodiment of an input/output (I/O) buffer. As shown, an I/O buffer 200 comprises a core unit 10, level shifters 20", a pull-up driver 30", a pull-down driver 40", a power on reset circuit 70, a weak pull-up resistor 80, and a weak pull-down resistor 90. For example, an output terminal OT of the I/O buffer 200 can be coupled to a pad or a bus (not shown) but is not limited thereto, and the pull-up driver 30", the pull-down driver 40", the weak pull-up resistor 80 and the weak pull-down resistor 90 can each be regarded as a driving unit.

The level shifters 20" are powered by the core power voltage VDD_CORE and the I/O power voltage VDD_IO, receiving and level shifting signals, such as control signals PJ, SN, WPUJ and WPD and an output enabling signal OE, and outputting driving signals PJ_HV, SN_HV, OE_HV, WPUJ_HV and WPD_HV to control the pull-up driver 30", the pull-down driver 40", the weak pull-up resistor 80, and the weak pull-down resistor 90. The pull-up driver 30" is coupled between the I/O power voltage VDD_IO and the output terminal OT of the I/O buffer 200, pulling the output terminal OT of the I/O buffer 200 to a strong "1" state (first logic state) according to the driving signals PJ_HV and OE_HV.

The pull-down driver 40" is coupled between the output terminal OT of the I/O and the ground voltage GND, pulling the output terminal OT of the I/O buffer 200 to a strong "0" state (second logic state) according to the driving signals SN_HV and OE_IV. The weak pull-up resistor 80 is coupled between the I/O power voltage VDD_IO and the output terminal OT of the I/O buffer 200, pulling the output terminal OT of the I/O buffer 200 to a weak "1" state (third logic state) according to the driving signals WPDJ_HV.

The weak pull-down resistor 90 is coupled between the output terminal OT of the I/O and the ground voltage GND, pulling the output terminal OT of the I/O buffer 200 to a weak "0" state (fourth logic state) according to the driving signals WPD_HV. Alternatively, when the pull-up driver 30", the pull-down driver 40", the power on reset circuit 70, the weak pull-up resistor 80, and the weak pull-down resistor 90 can be turned off by the driving signals PJ_HV, SN_HV, OE_HV, WPUJ_HV and WPD_HV, the output terminal OT of the level shifter 200 can be set to a high impedance state (fifth logic state).

For example, the level shifters 20" can be implemented by the level shifters 21A, 21B, 21C, . . . , or 21I capable of setting the output signals thereof to a pre-defined logic level when the core power voltage VDD_CORE is not ready during power-up. In addition, the power on reset circuit 70 powered by the I/O power voltage VDD_IO is optional, which generates a control signal SR to control signal the switching element 60 coupled between the node N2 and the ground voltage GND when the level shifters 20 is implemented by the disclosed level shifter 21D, 21E, 21H, 21I, 21J, 21K or 21L.

As the level shifters 20" are implemented by the level shifters 21A, 21B, 21C, . . . , or 21L, the driving signals PJ_HV, SN_HV, OE_HV, WPUJ_HV and WPD_HV thereof can be set to a pre-defined logic level when the core power voltage VDD_CORE is not ready during power-up.

Hence, when the core power voltage VDD_CORE is not ready during power-up, the output terminal OT of I/O buffer 200 can be selectively set to one of the five logic states, such as strong "0", strong "1", weak "0", weak "1" and high impedance, according to the driving signals PJ_HV, SN_HV, OE_HV, WPUJ_HV and WPD_HV from the level shifters 20". Namely, the level shifters can selectively set the output terminal OT to one of N predetermined logic states by applying the driving signals PJ_HV, SN_HV, OE_HV, WPUJ_HV and WPD_HV from the level shifters 20" to N driving units coupled to the output terminal OT.

Thus, data contention, abnormal operations, permanent damages or burn-outs caused when the core power voltage VDD_CORE is ready after the I/O power voltage VDD_IO can be prevented.

Figure 18:
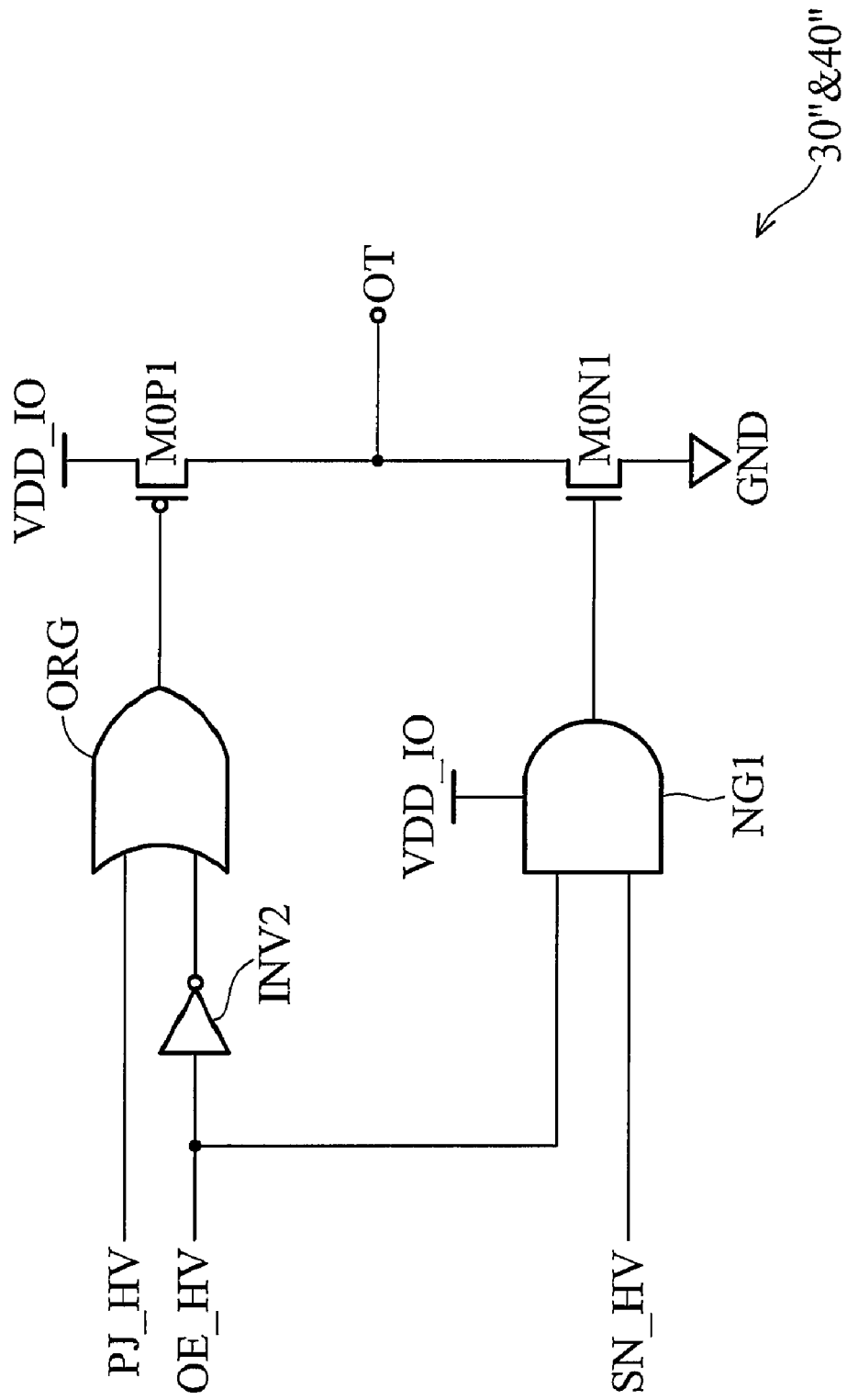
FIG. 18 shows an embodiment of a pull-up driver and a pull-down driver.

FIG. 18 shows an embodiment of a pull-up driver and a pull-down driver. As shown, a combination of a pull-up driver 30" and a pull-down driver 40" comprises a PMOS transistor MOP1, a NMOS transistor MON1, an inverter INV2, an OR gate ORG, and a AND gate NG1.

The inverter INV2 inverts the driving signal OE_HV to an inverse signal. The OR gate ORG comprises a first input terminal coupled to the driving signal PJ_HV, a second input terminal coupled to the inverse signal of the driving signal OE_HV and an output terminal coupled to a gate terminal of the PMOS transistor MOP1. The AND gate NG1 is powered by the I/O power voltage VDD_IO and comprises a first input terminal coupled to the driving signal OE_HV, a second input terminal coupled to the driving signal SN_HV and an output terminal coupled to a gate terminal of the NMOS transistor MON1. Source terminals of he PMOS transistor MOP1 and the NMOS transistor MON1 are coupled to the I/O power voltage VDD_IO and the ground voltage GND respectively, and drain terminals of which are served as the output terminal OT which can be coupled to an external element, such as a pad, a bus, a semiconductor device or an electronic device.

Figure 19B:
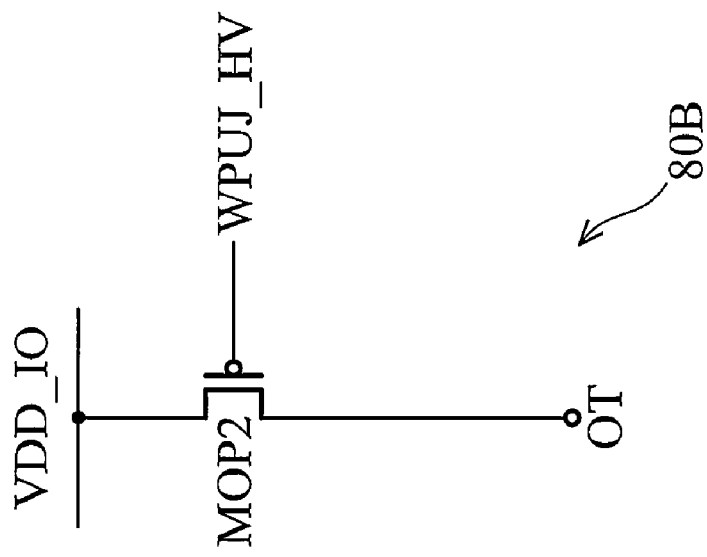
FIG. 19B shows another embodiment of a weak pull-up resistor.
Figure 19A:
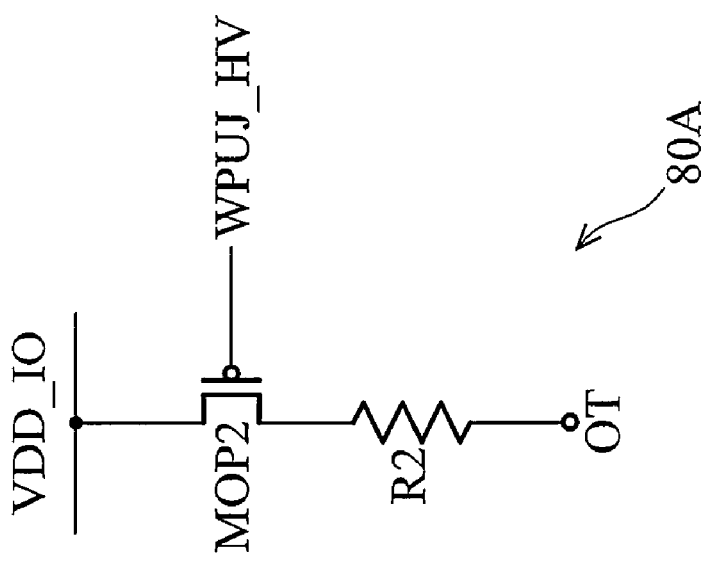
FIG. 19A shows an embodiment of a weak pull-up resistor.
Figure 20B:
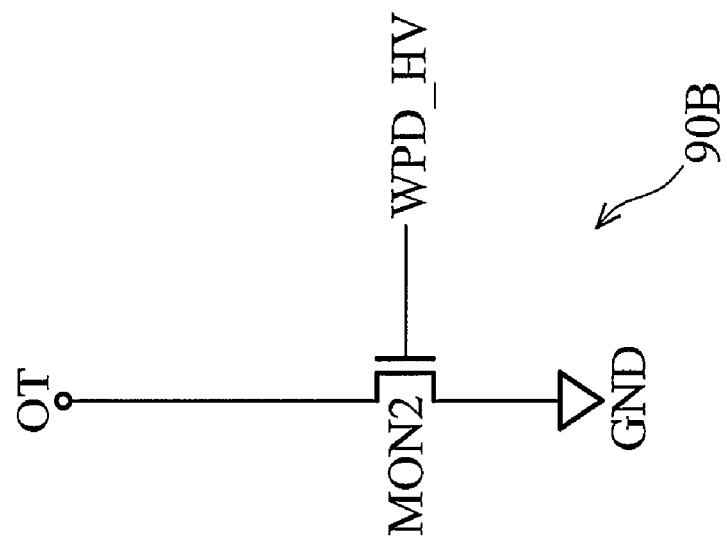
FIG. 20B shows another embodiment of a weak pull-down resistor.
Figure 20A:
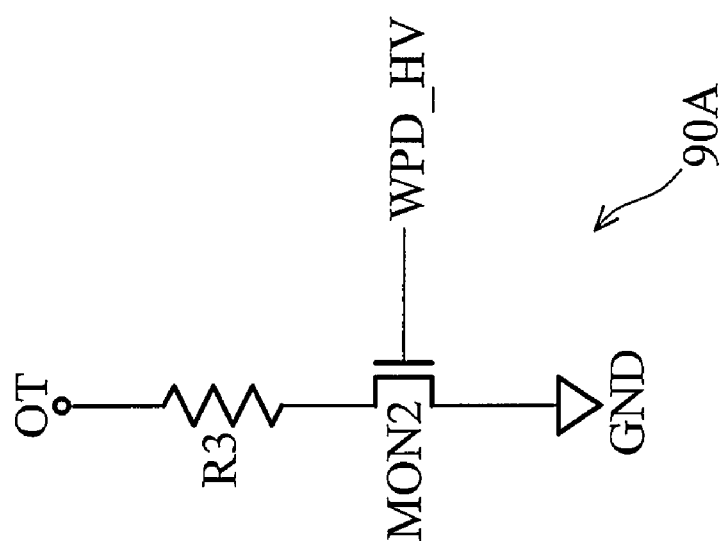
FIG. 20A shows an embodiment of a weak pull-down resistor.

FIG. 19A shows an embodiment of a weak pull-up resistor. As shown, a weak pull-up resistor 80A comprises a PMOS transistor MOP2 and a resistor R2 connected in series between the I/O power voltage VDD_IO and the output terminal OT. FIG. 20A shows an embodiment of a weak pull-down resistor. As shown, a weak pull-down resistor 90A comprises a NMOS transistor MON2 and a resistor R3 connected in series between the ground voltage GND and the output terminal OT.

FIG. 21 shows a relationship between the driving signals and logic states of output signal of the level shifter. With reference to FIGS. 18, 19A, 20A and 21, operations of the pull-up driver 30", the pull-down driver 40", the weak pull-up resistor 80A, and the weak pull-down resistor 90A under different driving signals are as follows.

First Logic State

The driving signal OE_HV from the level shifters 20" is set to low, the outputs of the OR gate ORG and the AND gate NG1 are pulled high and low respectively regardless of the driving signals PJ_HV and SN_HV, and thus, the pull-up driver 30" and the pull-down driver 40" are both disabled. The driving signal WPUJ_HV from the level shifters 20" is set to high (following the I/O power voltage VDD_IO), the PMOS transistor MOP2 is turned off and thus, the weak pull-up resistor 80A is disabled. The driving signal WPD_HV from the level shifters 20" is set to high (follow the I/O power voltage VDD_IO), and the NMOS transistor MON2 is turned on. Hence, the weak pull-down resistor 90A is enabled to pull the voltage level at the output terminal OP low to a predetermined level exceeding the ground voltage GND. Namely, the output terminal OP of the I/O buffer 200 is set to a logic state of weak "0".

Second Logic State

Here, the driving signal OE_HV from the level shifters 20" is set to low, such that the pull-up driver 30" and the pull-down driver 40" are both disabled. The driving signal WPD_HV from the level shifters 20" is set to low, and the NMOS transistor MON2 is turned off, and thus, the pull-down resistor 90A is disabled. The driving signal WPUJ_HV from the level shifters 20" is set to low, the PMOS transistor MOP2 is turned on. Hence, the weak pull-up resistor 80A is enabled to pull the voltage level at the output terminal OT high to a predetermined level less than the I/O power voltage VDD_IO. Namely, the output terminal OT of the I/O buffer 200 is set to a logic state of weak "1".

Third Logic State

In this case, the driving signal OE_HV from the level shifters 20" is set to low, such that the pull-up driver 30" and the pull-down driver 40" are both disabled. The driving signal WPD_HV from the level shifters 20" is set to low, and the NMOS transistor MON2 is turned off, and thus, the pull-down resistor 90A is disabled. The driving signal WPUJ_HV from the level shifters 20" is set to high, the PMOS transistor MOP2 is turned off, and thus, the pull-up resistor 80A is disabled. As the pull-up driver 30", the pull-down driver 40", the weak pull-up resistor 80A and the pull-down resistor 90A are all disabled, the voltage level at the output terminal OT is maintained at a high impedance state (also called floating). Namely, the output terminal OT of the I/O buffer 200 is-set to a logic state of high impedance.

Fourth Logic State

In this case, the driving signal WPUJ_HV and WPD_HV are set to high and low respectively, such that the pull-up resistor 80A and the pull-down resistor 90A are both disabled. The driving signal PJ_HV is set high, and the output of the OR gate ORG is pulled high, and thus, the pull-up driver 30" is disabled. The driving signals OE_HV and SN_HV from the level shifters 20" are set to high (matching the I/O power voltage VDD_IO), such that the output of the AND gate NG1 is pulled high. Hence, the pull-down driver 40" is enabled to pull low the voltage level at the output terminal OT to the ground voltage GND. Namely, the output terminal OT of the I/O buffer 200 is set to a logic state of strong "0".

Fifth Logic State

In this case, the driving signal WPUJ_HV and WPD_HV are set to high and low respectively, such that the pull-up resistor 80A and the pull-down resistor 90A are both disabled. The driving signal SN_HV is set low, and the output of the AND gate NG1 is pulled low, and thus, the pull-down driver 40" is disabled. The driving signals OE_HV and PJ_HV from the level shifters 20" are set to high (follow the I/O power voltage VDD_IO) and low respectively, such that the output of the OR gate ORG is pulled low. Hence, the pull-down driver 30" is enabled to pull the voltage level at the output terminal OT high to follow the I/O power voltage VDD_IO. Namely, the output terminal OT of the I/O buffer 200 is set to a logic state of strong "1".

Because the I/O buffer can set voltage level at the output terminal thereof to one of N predetermined logic state when the core power voltage is not ready during power-up, data contention, abnormal operation, permanent damage or burn-out in this time interval are prevented.

FIG. 19B shows another embodiment of a weak pull-up resistor. As shown, a weak pull-up resistor 80B is similar to the weak pull-up resistor 80A shown in FIG. 19A, differing only in that the resistor R2 is omitted and the size of the PMOS transistor MOP2 is modified. In this case, the size of the PMOS transistor MOP2 is modified to be much smaller than that of the PMOS transistor MOP1 in the pull-up deriver 30", such that the output terminal OP of the I/O buffer 200 is pulled high slowly and set to a logic state of weak "1" rather than the strong "1". FIG. 20B shows another embodiment of a weak pull-down resistor. As shown, a weak pull-down resistor 90B is similar to the weak pull-up resistor 90A shown in FIG. 20A, differing only in that the resistor R3 is omitted and the size of the NMOS transistor MON2 is modified. In this case, the size of the NMOS transistor MON2 is modified to be much smaller than that of the NMOS transistor MON1 in the pull-down driver 40", such that the output terminal OT of the I/O buffer 200 can be pulled low slowly and set to a logic state of weak "0" rather than the strong "0". In some example, the resistors R2 and R3 can be replaced with at least one of diode or diode-connected transistor.

Figure 22:
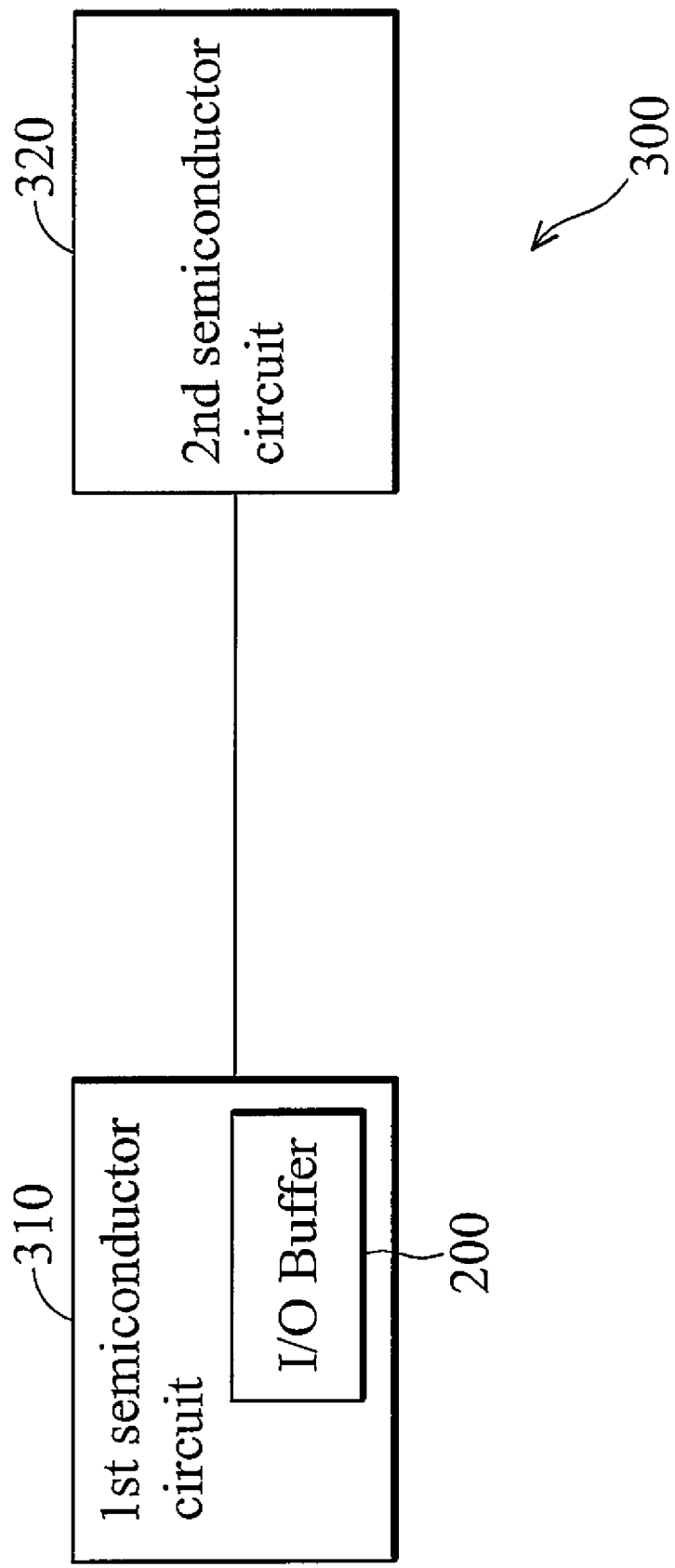
FIG. 22 shows an embodiment of an electronic system.

FIG. 22 shows an embodiment of an electronic system. As shown, an electronic system 300 comprises first and second semiconductor devices 310 and 320 coupled to each other by a pad, a bus, a wire or the like. For example, semiconductor devices 310 and 320 can be integrated circuits (IC), chips, motor drives or optical heads, but are not limited thereto.

The semiconductor device 310 comprises the disclosed I/O buffer 200 capable of setting voltage level at the output terminal thereof to one of N predetermined logic states when the core power voltage is not ready during power-up. Hence, during power-up, data contention, abnormal operations and abnormal power on current can be prevented and more stable operation can be obtained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An I/O buffer, comprising:
   a plurality of the level shifters, each comprising:
   a first logic unit powered by an input/output (I/O) power voltage, the first logic unit receiving input signals with a core power voltage, the first logic unit comprising first and second output terminals; and
   a first driver coupled to the first output terminal, matching a voltage level on the first output terminal with the I/O power voltage by AC coupling when the core power voltage is not ready during power-up; and
   a plurality of driving units coupled between the level shifters and a pad, the driving units selectively setting a logic state of the pad to one of N predetermined logic states according to the voltages on the first or second output terminal of the level shifters during power-up, wherein N predetermined logic states comprise a strong "1" state, a strong "0" state, a weak "1" state, a weak "0" state and a high impedance state, and the driving units comprise:
   a pull-up driver coupled between the I/O power voltage and the pad, the pull-up driver setting the logic state of the pad to the strong "1" state when turning on;
   a pull-down driver coupled between the pad and a ground voltage, the pull-down driver setting the logic state of the pad to the strong "0" state when turning on;
   a weak pull-up resistor coupled between the pad and the I/O power voltage, the weak pull-up resistor setting the logic state of the pad to the weak "1" state when turning on; and
   a weak pull-down resistor coupled between the pad and the ground voltage, the weak pull-down resistor setting the logic state of the pad to the weak "0" state when turning on, wherein when the pull-up driver, the pull-down driver, the weak pull-up resistor and the weak pull-down resistor are turned off, the logic state of the pad is set at the high impedance state.

2. The I/O buffer of claim 1, wherein the first driver comprises:
   a capacitor coupled between the first output terminal and the I/O power voltage;
   a diode comprising a first terminal connected to a ground voltage; and
   a transistor coupled between the diode and the first output terminal and comprising a control terminal coupled to the I/O power voltage.

3. A level shifter, comprising:
   a first logic unit powered by an input/output (I/O) power voltage, the first logic unit receiving input signals with a core power voltage, the first logic unit comprising first and second output terminals;
   a first driver coupled to the first output terminal, matching a voltage level on the first output terminal with the I/O power voltage by AC coupling when the core power voltage is not ready during power-up, wherein the first driver comprises:
   a capacitor coupled between the first output terminal and the I/O power voltage;
   a diode comprising a first terminal connected to a ground voltage: and
   a transistor coupled between the diode and the first output terminal and comprising a control terminal coupled to the I/O power voltage; and
   a second driver coupled to the second output terminal, pulling a voltage level on the second output terminal to a ground voltage by a control signal from an external circuit.

4. The level shifter as claimed in claim 3, wherein the second driver is disabled by the external circuit when the core power voltage and the I/O power voltage are both ready.

5. The level shifter as claimed in claim 4, wherein the second driver comprises a switching element coupled between the second output terminal and the ground voltage and having a control terminal coupled to the control signal from the external circuit.

6. The level shifter as claimed in claim 3, wherein after the I/O power voltage and the core power voltage are both ready, the first logic unit operates based on the input signals regardless of the first driver.

7. The level shifter as claimed in claim 6, wherein the capacitor comprises a MOS transistor with a drain and a source both connected to the I/O power voltage and a gate coupled to the first output terminal.

8. The level shifter as claimed in claim 3, wherein the first logic unit comprises:
   a latch unit coupled between the I/O power voltage and the first and second output terminals; and
   a differential pair coupled between the ground voltage and the first and second output terminals.

9. The level shifter as claimed in claim 8, wherein the latch unit comprises two cross-coupled MOS transistors or two cross-coupled inverters.

10. A level shifter, comprising:
    a first logic unit powered by an input/output (I/O) power voltage, the first logic unit receiving input signals with a core power voltage, the first logic unit comprising first and second output terminals;
    a first driver coupled to the first output terminal, matching a voltage level on the first output terminal with the I/O power voltage by AC coupling when the core power voltage is not ready during power-up, wherein the first driver comprises a capacitor coupled between the first output terminal and the I/O power voltage; and
    a second driver coupled to the second output terminal, pulling a voltage level on the second output terminal to a ground voltage, wherein the second driver comprises:
    a first transistor comprising a first terminal coupled to the second output terminal, a second terminal coupled to the ground voltage, and a control terminal coupled to the first output terminal, wherein the second driver is controlled by the first driver.

11. The level shifter as claimed in claim 10, wherein the second driver further comprises:
a diode comprising a first terminal coupled to the second output terminal and a second terminal coupled to the first terminal of the first transistor.

12. The level shifter as claimed in claim 10, wherein after the I/O power voltage and the core power voltage are both ready, the first logic unit operates based on the input signals regardless of the first and second drivers.

13. The level shifter as claimed in claim 10, wherein the capacitor comprises a MOS transistor with a drain and a source both connected to the I/O power voltage and a gate coupled to the first output terminal.

14. The level shifter as claimed in claim 10, wherein the first logic unit comprises:
a latch unit coupled between the I/O power voltage and the first and second output terminals; and
a differential pair coupled between the ground voltage and the first and second output terminals.

15. The level shifter as claimed in claim 14, wherein the latch unit comprises two cross-coupled MOS transistors or two cross-coupled inverters.

16. The level shifter as claimed in claim 10, wherein the second driver further comprises:
a second transistor comprising a first terminal and a third terminal coupled to the second output terminal, a second terminal coupled to the first terminal of the first transistor.

17. A circuit, comprising:
a plurality of I/O buffers, each comprising:
at least one level shifter for generating an initial state signal when the core power voltage is not ready during power-up; and
at least one driving unit coupled between the level shifter and a pad, the at least one driving unit comprising one of a pull-up driver, a pull-down driver, a weak pull-up resistor and a weak pull-down resistor to set a logic state of the pad to a predetermined logic state according to the voltages on the first or second output terminal of the level shifter during power-up,
wherein the pull-up driver is coupled between the I/O power voltage and the pad to set the logic state of the pad to the strong "1" state when turning on, a pull-down driver is coupled between the pad and a ground voltage to set the logic state of the pad to the strong "0" state when turning on; a weak pull-up resistor is coupled between the pad and the I/O power voltage to set the logic state of the pad to the weak "1" state when turning on; and a weak pull-down resistor is coupled between the pad and the ground voltage to set the logic state of the pad to the weak "0" state when turning on.

18. The circuit as claimed in claim 17, wherein the at least driving unit comprises two of the pull-up driver, the pull-down driver, the weak pull-up resistor and the weak pull-down resistor.

19. The circuit as claimed in claim 17, wherein the at least driving unit comprises three of the pull-up driver, the pull-down driver, the weak pull-up resistor and the weak pull-down resistor.

* * * * *